(12) United States Patent
Lin et al.

(10) Patent No.: US 11,502,881 B2
(45) Date of Patent: *Nov. 15, 2022

(54) CHANNEL EQUALIZATION FOR MULTI-LEVEL SIGNALING

(71) Applicant: Micron Technology, Inc., Boise, ID (US)

(72) Inventors: Feng Lin, Boise, ID (US); Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/229,092

(22) Filed: Apr. 13, 2021

(65) Prior Publication Data

US 2021/0234733 A1   Jul. 29, 2021

Related U.S. Application Data

(63) Continuation of application No. 16/415,512, filed on May 17, 2019, now Pat. No. 10,985,953, which is a
(Continued)

(51) Int. Cl.
*H04L 25/49*   (2006.01)
*G11C 7/20*   (2006.01)
(Continued)

(52) U.S. Cl.
CPC ........ *H04L 25/4917* (2013.01); *G11C 7/1057* (2013.01); *G11C 7/1069* (2013.01);
(Continued)

(58) Field of Classification Search
CPC ..... H04L 25/03057; H04L 2025/03363; H04L 27/02
(Continued)

(56) References Cited

U.S. PATENT DOCUMENTS 5,757,242 A   5/1998   Chow et al.
6,262,607 B1   7/2001   Suzuki
(Continued)

FOREIGN PATENT DOCUMENTS

CN   102983772 A   3/2013
CN   103391092 A   11/2013
(Continued)

OTHER PUBLICATIONS

ISA/KR, International Search Report and Written Opinion of the International Searching Authority, Int'l. Appl. No. PCT/US2018/044377, dated Nov. 8, 2018, Korean Intellectual Property Office, Seo-gu, Daejeon, Republic of Korea, 15 pgs.
(Continued)

*Primary Examiner* — Sam K Ahn
*Assistant Examiner* — Gina M Mckie
(74) *Attorney, Agent, or Firm* — Holland & Hart LLP

(57) ABSTRACT

A memory interface may include a transmitter that generates multi-level signals made up of symbols that convey multiple bits of data. The transmitter may include a first data path for a first bit (e.g., a least significant bit (LSB)) in a symbol and a second data path for a second bit (e.g., the most significant bit (MSB)) in the symbol. Each path may include a de-emphasis or pre-emphasis buffer circuit that inverts and delays signals received at the de-emphasis or pre-emphasis buffer circuit. The delayed and inverted data signals may control de-emphasis or pre-emphasis drivers that are configured to apply de-emphasis or pre-emphasis to a multi-level signal.

20 Claims, 7 Drawing Sheets

Related U.S. Application Data continuation of application No. 15/885,536, filed on Jan. 31, 2018, now Pat. No. 10,447,512.

(60) Provisional application No. 62/542,166, filed on Aug. 7, 2017.

(51) Int. Cl.
*H04L 25/03* (2006.01)
*H04L 7/00* (2006.01)
*G11C 7/10* (2006.01)

(52) U.S. Cl.
CPC .......... *G11C 7/1084* (2013.01); *G11C 7/1096* (2013.01); *G11C 7/20* (2013.01); *H04L 7/0037* (2013.01); *H04L 25/03038* (2013.01); *H04L 25/03343* (2013.01); *G11C 7/1063* (2013.01); *H04L 2025/03363* (2013.01)

(58) Field of Classification Search
USPC ........................................................ 375/232
See application file for complete search history.

(56) References Cited

U.S. PATENT DOCUMENTS

| | | |
|---|---|---|
| 6,294,937 B1 | 9/2001 | Crafts et al. |
| 6,396,329 B1 | 5/2002 | Zerbe |
| 6,574,758 B1 | 6/2003 | Eccles |
| 6,894,529 B1 | 5/2005 | Chong et al. |
| 7,126,378 B2 | 10/2006 | Stojanovic et al. |
| 7,269,212 B1 | 9/2007 | Chau et al. |
| 7,308,044 B2 | 12/2007 | Zerbe et al. |
| 7,308,058 B2 | 12/2007 | Zerbe et al. |
| 7,509,368 B2 | 3/2009 | Anders et al. |
| 7,598,762 B2 | 10/2009 | Byun et al. |
| 7,650,526 B2 | 1/2010 | Alon et al. |
| 7,692,447 B2 | 4/2010 | Cranford et al. |
| 7,714,615 B2 | 5/2010 | Liang et al. |
| 7,755,366 B2 | 7/2010 | Hosoe et al. |
| 7,853,846 B2 | 12/2010 | Cannon et al. |
| 7,961,008 B2 | 6/2011 | Kim et al. |
| 8,004,869 B2 | 8/2011 | Gruber et al. |
| 8,026,740 B2 | 9/2011 | Hollis |
| 8,049,530 B2 | 11/2011 | Batt |
| 8,072,253 B2 | 12/2011 | Kaeriyama et al. |
| 8,436,653 B2 | 5/2013 | Hollis |
| 8,570,789 B2 | 10/2013 | Chang |
| 8,604,828 B1 | 12/2013 | Bickford et al. |
| 8,669,792 B2 | 3/2014 | Rao |
| 8,781,022 B1 | 7/2014 | Chang et al. |
| 8,816,738 B2 | 8/2014 | Tatapudi et al. |
| 8,854,236 B2 | 10/2014 | Hollis |
| 9,048,824 B2 | 6/2015 | Chan et al. |
| 9,148,170 B2 | 9/2015 | Hollis |
| 9,203,662 B2 | 12/2015 | Hollis |
| 9,286,697 B2 | 3/2016 | Igarashi |
| 9,324,454 B2 | 4/2016 | Hollis |
| 9,337,807 B2 | 5/2016 | Hollis et al. |
| 9,444,455 B2 | 9/2016 | Bhuiyan et al. |
| 9,509,535 B2 | 11/2016 | Hollis |
| 9,525,573 B2 | 12/2016 | Fiedler |
| 9,577,854 B1 | 2/2017 | Hollis |
| 9,621,160 B2 | 4/2017 | Tang |
| 9,627,357 B2 | 4/2017 | Shoemaker et al. |
| 9,712,257 B1 | 7/2017 | Tan et al. |
| 9,755,620 B1 | 9/2017 | Lin et al. |
| 9,831,874 B1 | 11/2017 | Fortin et al. |
| 9,917,711 B2 | 3/2018 | Ulrich |
| 9,948,300 B1 | 4/2018 | Greeff |
| 9,972,363 B2 | 5/2018 | Tang |
| 10,015,027 B2 | 7/2018 | Schober |
| 10,043,557 B1 | 8/2018 | Hollis |
| 10,193,634 B2 | 1/2019 | Li et al. |
| 10,277,435 B2 | 4/2019 | Hollis et al. |
| 10,770,430 B1 | 9/2020 | Kim et al. |
| 2002/0036923 A1 | 3/2002 | Chung et al. |
| 2002/0136343 A1 | 9/2002 | Cranford et al. |
| 2002/0149402 A1 | 10/2002 | Martin et al. |
| 2003/0070126 A1 | 4/2003 | Werner et al. |
| 2003/0161393 A1 | 8/2003 | Ahn |
| 2004/0085841 A1 | 5/2004 | Lim et al. |
| 2005/0057280 A1 | 3/2005 | Groen et al. |
| 2005/0258870 A1 | 11/2005 | Mitby et al. |
| 2006/0091901 A1 | 5/2006 | Kim |
| 2006/0091911 A1 | 5/2006 | Rho |
| 2006/0181303 A1 | 8/2006 | Dreps et al. |
| 2006/0186915 A1 | 8/2006 | Werner et al. |
| 2006/0290439 A1 | 12/2006 | Martin et al. |
| 2007/0024476 A1 | 2/2007 | Saeki et al. |
| 2007/0136621 A1 | 6/2007 | Alon et al. |
| 2007/0245214 A1* | 10/2007 | Ramamoorthy .... G06F 11/1072 714/758 |
| 2008/0129348 A1 | 6/2008 | Shau |
| 2008/0144411 A1 | 6/2008 | Tsern |
| 2009/0059712 A1 | 3/2009 | Lee et al. |
| 2009/0067278 A1 | 3/2009 | Choi et al. |
| 2009/0072860 A1 | 3/2009 | Lee |
| 2009/0298457 A1 | 12/2009 | Jakobs |
| 2009/0313521 A1 | 12/2009 | Hollis |
| 2010/0001758 A1 | 1/2010 | Dreps et al. |
| 2010/0054011 A1 | 3/2010 | Kim |
| 2010/0164539 A1 | 7/2010 | Balamurugan et al. |
| 2011/0299354 A1 | 12/2011 | Scheuerlein et al. |
| 2011/0310949 A1 | 12/2011 | Zerbe et al. |
| 2011/0310992 A1 | 12/2011 | Franzon et al. |
| 2012/0032714 A1 | 2/2012 | Shimazaki et al. |
| 2012/0044983 A1 | 2/2012 | Kerr |
| 2012/0092057 A1 | 4/2012 | Yu |
| 2012/0288027 A1 | 11/2012 | Stojanovic et al. |
| 2013/0094561 A1 | 4/2013 | Raphaeli et al. |
| 2013/0100737 A1 | 4/2013 | Kwak |
| 2013/0113521 A1 | 5/2013 | Song |
| 2013/0128943 A1 | 5/2013 | Doron et al. |
| 2013/0248801 A1 | 9/2013 | Yamamoto |
| 2014/0003549 A1 | 1/2014 | Won et al. |
| 2014/0035625 A1 | 2/2014 | Hafizi et al. |
| 2014/0169429 A1 | 6/2014 | Ran |
| 2014/0176196 A1 | 6/2014 | Li et al. |
| 2014/0226734 A1 | 8/2014 | Fox et al. |
| 2014/0244991 A1 | 8/2014 | Akdemir et al. |
| 2015/0062792 A1 | 3/2015 | Lee et al. |
| 2015/0071651 A1 | 3/2015 | Asmanis et al. |
| 2015/0104196 A1 | 4/2015 | Bae et al. |
| 2015/0171829 A1 | 6/2015 | Song et al. |
| 2015/0187441 A1 | 7/2015 | Hollis |
| 2015/0206867 A1 | 7/2015 | Lim et al. |
| 2015/0229325 A1 | 8/2015 | Hollis |
| 2015/0270010 A1 | 9/2015 | Kang |
| 2015/0357915 A1 | 12/2015 | Kim |
| 2015/0381232 A1 | 12/2015 | Ulrich |
| 2016/0065211 A1 | 3/2016 | Hsu |
| 2016/0087819 A1 | 3/2016 | Poulton |
| 2016/0094202 A1 | 3/2016 | Hollis et al. |
| 2016/0119169 A1 | 4/2016 | Schober |
| 2016/0124873 A1 | 5/2016 | Xu et al. |
| 2016/0180897 A1 | 6/2016 | Shen et al. |
| 2016/0181950 A1 | 6/2016 | Yoscovich et al. |
| 2016/0182044 A1 | 6/2016 | Addepalli et al. |
| 2016/0189775 A1 | 6/2016 | Buchanan |
| 2016/0224243 A1 | 8/2016 | Son et al. |
| 2016/0224451 A1 | 8/2016 | Gorman et al. |
| 2016/0258997 A1 | 9/2016 | Tang et al. |
| 2016/0285451 A1 | 9/2016 | Mccall et al. |
| 2016/0285453 A1 | 9/2016 | Thilenius et al. |
| 2016/0301393 A1 | 10/2016 | Jung |
| 2016/0374091 A1 | 12/2016 | Saeki |
| 2016/0378597 A1 | 12/2016 | Chung et al. |
| 2017/0054656 A1 | 2/2017 | Luo et al. |
| 2017/0060803 A1 | 3/2017 | Shim |
| 2017/0075757 A1 | 3/2017 | Im et al. |
| 2017/0083316 A1 | 3/2017 | Burger et al. |
| 2017/0118048 A1 | 4/2017 | Ulrich |
| 2017/0133103 A1 | 5/2017 | Kwon |

(56) References Cited

U.S. PATENT DOCUMENTS

| | | |
|---|---|---|
| 2017/0141025 A1 | 5/2017 | Lee |
| 2017/0212695 A1 | 7/2017 | Hollis et al. |
| 2017/0222845 A1 | 8/2017 | Zerbe et al. |
| 2017/0301392 A1 | 10/2017 | Kim et al. |
| 2017/0337979 A1 | 11/2017 | Lee et al. |
| 2018/0033478 A1 | 2/2018 | Tanaka et al. |
| 2018/0054134 A1 | 2/2018 | Moon et al. |
| 2018/0123593 A1 | 5/2018 | Choi |
| 2018/0278440 A1 | 9/2018 | Dong |
| 2018/0302264 A1 | 10/2018 | Liao et al. |
| 2019/0007167 A1 | 1/2019 | Shih |
| 2019/0013809 A1 | 1/2019 | Greeff |
| 2019/0043543 A1 | 2/2019 | Butterfield |
| 2019/0044762 A1 | 2/2019 | Lin |
| 2019/0044764 A1 | 2/2019 | Hollis et al. |
| 2019/0044766 A1 | 2/2019 | Lin et al. |
| 2019/0044769 A1 | 2/2019 | Hollis |
| 2020/0279793 A1 | 9/2020 | Xie et al. |

FOREIGN PATENT DOCUMENTS

| | | |
|---|---|---|
| JP | 2007515130 A | 6/2007 |
| KR | 10-0892337 B1 | 4/2009 |
| KR | 20150050021 A | 5/2015 |
| TW | 201611031 A | 3/2016 |
| TW | I530167 B | 4/2016 |
| TW | 201826497 A | 7/2018 |
| TW | 201839474 A | 11/2018 |

OTHER PUBLICATIONS

ISA/KR, International Search Report and Written Opinion of the International Searching Authority, Int'l. Appl. No. PCT/US2018/043648, dated Nov. 7, 2018, Korean Intellectual Property Office, Seo-gu, Daejeon, Republic of Korea, 14 pgs.

ISA/KR, International Search Report and Written Opinion of the International Searching Authority, Int'l. Appl. No. PCT/US2018/043311, dated Oct. 31, 2018, Korean Intellectual Property Office, Seo-gu, Daejeon, Republic of Korea, 12 pgs.

Nadeesha Amarasinghe "A Single-ended Simultaneously Bidirectional Transceiver for Ultra-short Reach Die to Die Links" Master of Applied Science Graduate Department of Electrical and Computer Engineering, University of Toronto, 2016, 79pgs.

ISA/KR, International Search Report and Written Opinion of the International Searching Authority, Int'l. Appl. No. PCT/US2018/044411, dated Nov. 14, 2018, Korean Intellectual Property Office, Seo-gu, Daejeon, Republic of Korea, 15 pgs.

International Search Report and Written Opinion of the International Searching Authority, for PCT/US2018/044381, dated Nov. 8, 2018, 15 pgs..

English Translation of Office Action dated Apr. 23, 2019 issued in Taiwan Patent Application No. 107127205, 8 pgs.

English Translation of Taiwan Intellectual Property Office, "Office Action," issued in connection with Application No. 107127204, dated May 29, 2019, 9 pages.

IPO, "Office Action," issued in connection with ROC (Taiwan) Patent Application No. 108144352, dated Feb. 6, 2020 (5 pages).

China National Intellectual Property Office, "Office Action," issued in connection with Chinese Patent Application No. 201880045340.2, dated Jul. 28, 2020 (21 pages with translation).

China National Intellectual Property Administration, "First Office Action," and "First Search" issued in connection with Chinese Patent Application No. 201880045063.5, dated Aug. 5, 2020 (15 pages with Translation).

Korean Intellectual Property Office, "Notice of Reasons for Rejection," issued in connection with Korean Patent Application No. 10-2020-7002771, dated Nov. 9, 2020 (8 pages).

Korean Intellectual Property Office, "Notice of Reasons for Rejection," issued in connection with Korean Patent Application No. 10-2020-7002772, dated Nov. 9, 2020 (10 pages).

Korean Intellectual Property Office, "Notice of Reasons for Rejection," issued in connection with Korean Patent Application No. 10-2020-7003309, dated Nov. 11, 2020 (9 pages).

Korean Intellectual Property Office, "Notice of Reasons for Rejection," issued in connection with Korean Patent Application No. 10-2020-7002923, dated Nov. 11, 2020 (12 pages).

Korean Intellectual Property Office, "Notice of Reasons for Rejection," issued in connection with Korean Patent Application No. 10-2020-7003063, dated Dec. 21, 2020 (5 pages).

The Korean Intellectual Property Office, "Notice of Reason for Rejection," issued in connection with Korean Patent Application No. 10-2020-7003466, dated Dec. 23, 2020 (5 pages).

European Patent Office, "Extended Search Report," issued in connection with European Patent Application No. 18842968.2, dated Mar. 22, 2021 (10 pages).

European Patent Office, "Extended Search Report," issued in connection with European Patent Application No. 18844508.4, dated Mar. 17, 2021 (11 pages).

Esch, Gerald Jr. ,et al., "Design of CMOS IO Drivers with Less Sensitivity to Process, Voltage, and Temperature Variations," Electronic Design, Test and Applications, Second IEEE International Workshop on Perth, Australia, Jan. 28-30, 2004 (6 pages).

European Patent Office, "Extended Search Report," issued in connection with European Patent Application No. 18844814.6, dated Mar. 15, 2021 (8 pages).

European Patent Office, "Extended Search Report," issued in connection with European Patent Application No. 18844382.4, dated Mar. 15, 2021 (9 pages).

European Patent Office, "Extended Search Report," issued in connection with European Patent Application No. 18844743.7, dated Mar. 18, 2021 (9 pages).

Bing et al., "Handbook of Mathematics, Physics and Chemistry Concepts, Formulas and Theorems in Senior High School," Jun. 30, 2016, pp. 2-3, Sichuan Lexicographical Publishing House.

China National Intellectual Property Office, "First Office Action," issued in connection with Chinese Patent Application No. 201880045340.2, dated Jan. 22, 2021.

Korean Intellectual Property Office, "Decision of Rejection," issued in connection with Korean Patent Application 10-2020-7002772, dated Apr. 16, 2021 (5 pages).

KIPO, "Notice of Allowance," issued in connection with Korean Patent Application No. 10-2020-7002771, dated Jun. 18, 2021, (4 pages).

Korean Intellectual Property Office, "Notice of Reasons for Rejection," issued in connection with Korean Patent Application No. 10-2020-7003063, dated Jun. 28, 2021 (5 pages).

International Search Report and Written Opinion received for PCT Patent Application No. PCT/US2018/043297, dated Nov. 6, 2018, 15 pages.

Notice of Allowance received for Korean Patent Application No. 10-2020-7002772, dated Jan. 24, 2022, 4 pages (2 pages of English Translation and 2 pages of Original Document).

Korean Intellectual Property Office, "Notice of Reasons for Rejection," issued in connection with Korean Patent Application No. 10-2021-7030015, dated Oct. 14, 2021 (10 pages).

Korean Intellectual Property Office, "Notice of Reasons for Rejection," issued in connection with Korean Patent Application No. 10-2021-7027086, dated Nov. 29, 2021 (6 pages).

Amarasinghe, Nadeesha, "A Single-Ended Simultaneously Bidirectional Transceiver for Ultra-Short Reach Die to Die Links," Thesis submitted for Degree of Master of Applied Science—Graduate Dept. of Electrical and Computer Engineering, Univ. Toronto, 2016.

Korean Intellectual Property Office, "Notice of Allowance," issued in connection with Korean Patent Application No. 10-2020-7002923, dated Oct. 29, 2021 (4 pages).

Chinese Patent Office, "Office Action and Search Report", issued in connection with Chinese Patent Application No. 202111252414.X dated Mar. 24, 2022 (9 pages).

Korean Patent Office, "Notice of Allowance", issued in connection with Korean Patent Application No. 10-2021-7030015 dated May 16, 2022 (4 pages).

(56) References Cited

OTHER PUBLICATIONS

Korean Patent Office, "Written Decision on Dismissal of Amendment", issued in connection with Korean Patent Application No. 10-2021-7025636 dated Sep. 26, 2022 (18 pages).

* cited by examiner

CHANNEL EQUALIZATION FOR MULTI-LEVEL SIGNALING

CROSS REFERENCES

The present Application for Patent is a continuation of U.S. patent application Ser. No. 16/415,512 by Lin et al., entitled "Channel Equalization For Multi-Level Signaling," filed May 17, 2019, which is a continuation of U.S. patent application Ser. No. 15/885,536 by Lin et al., entitled "Channel Equalization For Multi-Level Signaling," filed Jan. 31, 2018, which claims priority to U.S. Provisional Patent Application No. 62/542,166 by Lin, et al., entitled "Channel Equalization For Multi-Level Signaling," filed Aug. 7, 2017, assigned to the assignee hereof, and each of which expressly incorporated by reference herein.

RELATED REFERENCES

The present Application for Patent is related to U.S. patent application Ser. No. 15/885,532 (Ref. No. 2017-0389.00/US) by Lin, et al., entitled "Programmable Channel Equalization For Multi-Level Signaling," filed concurrently with the present application, assigned to the assignee hereof, and U.S. Provisional Patent Application No. 62/542,263 by Lin, et al., entitled "Programmable Channel Equalization For Multi-Level Signaling," filed Aug. 7, 2017, assigned to the assignee hereof, each of which is expressly incorporated by reference herein.

BACKGROUND

The following relates generally to channel equalization and more specifically to channel equalization for multi-level signaling.

Memory devices are widely used to store information in various electronic devices such as computers, wireless communication devices, cameras, digital displays, and the like. Information is stored by programing different states into memory cells of a memory device. For example, binary devices have two states, often denoted by a logic "1" or a logic "0." In other systems, more than two states may be stored. To access the stored information, a component of the memory device may read, or sense, the stored state in the memory cell. To store information, a component of the electronic device may write, or program, the state in the memory cell.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), self-selecting memory, and others. Memory devices may be volatile or non-volatile. Non-volatile memory, e.g., flash memories, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

DETAILED DESCRIPTION

A memory interface may enable communication of the information stored by a memory device (e.g., for use in graphics). But in some cases, the signals transferred by a memory interface may lose integrity due to distortions caused by the communication channel. For example, the signals may experience loss, delay, and reflections in the communication channel that alter the signals. If the signals experience too much alteration, the receiver may not be able to decode the signals and the information conveyed by the signals may be lost. When the signals are multi-level signals (e.g., multi-symbol signals) that convey multiple bits of information per unit interval, even more information may be lost compared to signals with fewer signals. Lost information may decrease system performance and overall user experience.

According to the techniques described herein, aspects of multi-level signals may be improved by applying de-emphasis or pre-emphasis prior to transferring the multi-level signals over a communications channel. The de-emphasized or pre-emphasized multi-level signals may compensate for channel distortions, which may increase the ability of a receiver to successfully obtain the information conveyed by the signals.

Features of the disclosure introduced above are further described below in the context of a memory device. Specific examples are then described for a memory device that supports multi-level signaling with de-emphasis. These and other features of the disclosure are further illustrated by and described with reference to apparatus diagrams, system diagrams, and flowcharts that relate to multi-level signaling (e.g., multi-symbol signaling).

Figure 1:
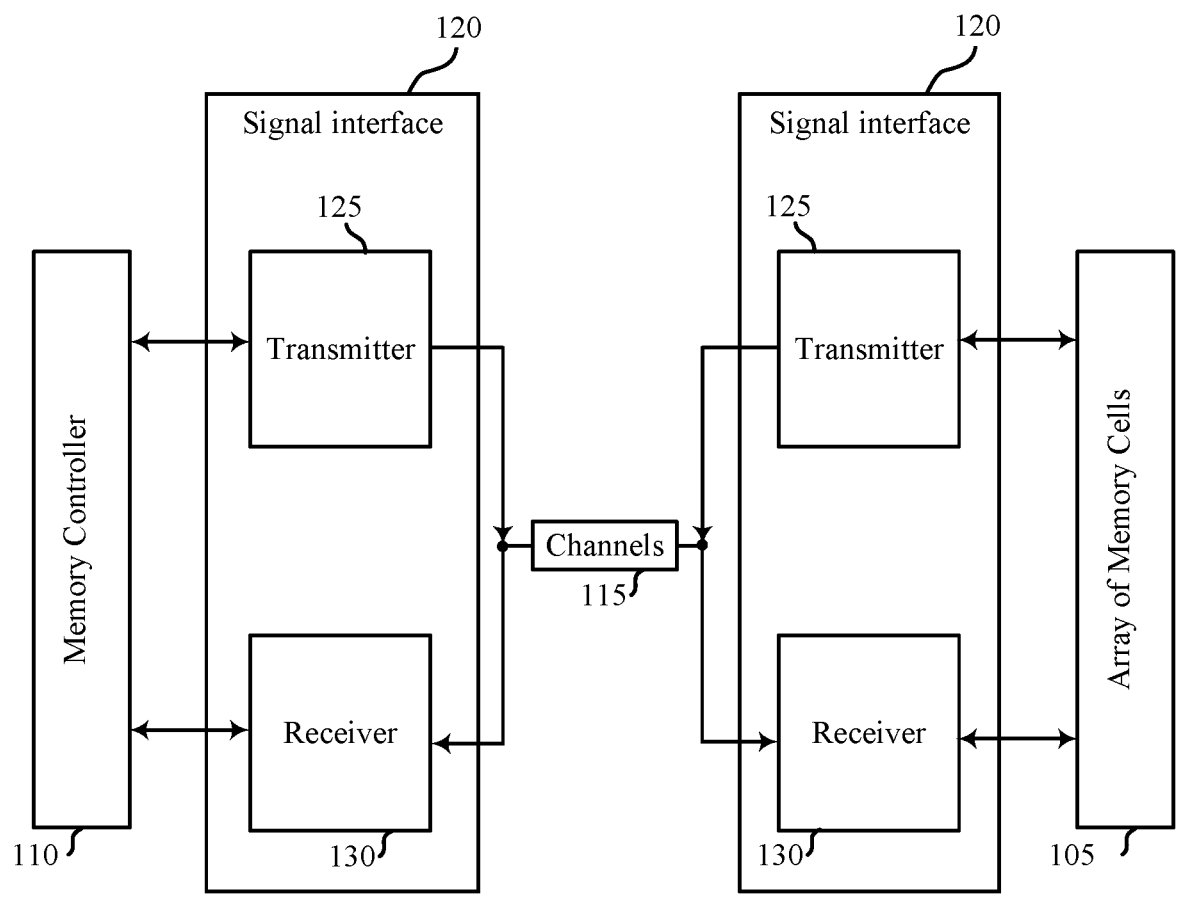
FIG. 1 illustrates an example of a memory device that supports channel equalization for multi-level signals in accordance with various aspect of the present disclosure.

FIG. 1 illustrates an example memory device 100 in accordance with various examples of the present disclosure. The memory device 100 may also be referred to as an electronic memory apparatus. The memory device 100 may be configured to use multi-level signaling to communicate data between various components of the memory device 100. Multi-level signaling may also be referred to herein as multi-symbol signaling and may be implemented via multi-level modulations schemes such as PAM2, PAM4, PAM8, etc. So some examples of the multi-level signaling may include PAM signaling such as PAM4 signaling, PAM8 signaling, etc. The memory device 100 may include an array of memory cells 105, a controller 110, a plurality of channels 115, signaling interfaces 120, other components, or a combination thereof. A signaling interface 120 may also be referred to as a memory interface 120.

A memory device 100 may use multi-level signaling to increase the amount of information transmitted using a given bandwidth of frequency resources. In binary-level signaling, two symbols of a signal (e.g., two voltages levels) are used to represent up to two logic states (e.g., logic state '0' or logic state '1'). In multi-level signaling, a larger library of symbols may be used to represent data. Each symbol may represent more than two logic states (e.g., logic states with multiple bits). For example, if the signal is capable of four unique symbols, the signal may be used to represent up to four logic states (e.g., '00', '01', '10', and '11'). As a result, multiple bits of data may be compressed into a single symbol, thereby increasing the amount of data communicated using a given bandwidth.

In some cases of multi-level signaling, the amplitude of the signal may be used to generate the different symbols. For example, a first amplitude level may represent '00', a second amplitude level may represent '01', a third amplitude level may represent '10', and a fourth amplitude level may represent '11'. One drawback of some multi-level signaling schemes is that the symbols may be separated by a smaller voltage difference than symbols in other signaling schemes (e.g., binary-level signaling schemes). The smaller voltage separation may make the multi-level signaling scheme more susceptible to errors caused by noise or other aspects. The voltage separation of symbols in the multi-level signaling scheme, however, may be expanded by increasing a peak-to-peak transmitted power of a transmitted signal. In some situations, however, such an increase to peak-to-peak transmitted power may not be possible or may be difficult to achieve due to fixed power supply voltages, fixed signal power requirements, or other factors. Consequently, to implement multi-level signaling a transmitter may use more power and/or a receiver may be susceptible to an increased error rate, when compared to a binary-level signaling scheme.

A multi-level signal (sometimes referred to as a multi-symbol signal) may be a signal that is modulated using a modulation scheme that includes three or more unique symbols to represent data (e.g., two or more bits of data). The multi-level signal may be an example of an M-ary signal that is modulated using a modulation scheme where M is greater than or equal to three, where M represents the number of unique symbols, levels, or conditions possible in the modulation scheme. A multi-level signal or a multi-level modulation scheme may be referred to as a non-binary signal or non-binary modulation scheme in some instances. Examples of multi-level (or M-ary) modulation schemes related to a multi-level signal may include, but are not limited to, pulse amplitude modulation (e.g., PAM4, PAM8), quadrature amplitude modulation (QAM), quadrature phase shift keying (QPSK), and/or others.

A binary-level signal (sometimes referred to as a binary-symbol signal) may be a signal that is modulated using a modulation scheme that includes two unique symbols to represent one bit of data. The binary-level signal may be an example of an M-ary modulation scheme where M is less than or equal to 2. Examples of binary-level modulation schemes related to a binary-level signal include, but are not limited to, non-return-to-zero (NRZ), unipolar encoding, bipolar encoding, Manchester encoding, PAM2, and/or others.

In some cases, the conditions of channels 115 may further reduce the voltage separation between multi-level signals and create inter-symbol interference (ISI), which may degrade the integrity of the multi-level signals and make them hard to detect. The channels may affect the multi-level signals to the extent that a receiver 130 cannot successfully obtain the information conveyed by the multi-level signals, which may negatively impact the performance of the memory device 100. According to the techniques described herein, a transmitter 125 may perform channel equalization prior to transmitting a multi-level signal over channels 115. For example, a transmitter 125 may de-emphasize or pre-emphasize a multi-level signal prior to transmitting the signal over channels 115. De-emphasizing or pre-emphasizing the multi-level signals may improve the separation between the signal levels and increase detectability at the receiver 130. In some cases, the transmitter 125 may perform other types of channel equalization such as feed-forward equalization (FFE). Although described with reference to de-emphasis and pre-emphasis, the channel equalization techniques disclosed herein are not limited to only that aspect and are related to broader aspects associated with equalization.

Each memory cell of the array of memory cells 105 may be programmable to store different states. For example, each memory cell may be programmed to store two or more logic states (e.g., a logic '0', a logic '1', a logic '00', a logic '01', a logic '10', a logic '11', etc.). A memory cell may store a charge representative of the programmable states in a capacitor; for example, a charged and uncharged capacitor may represent two logic states, respectively. The memory cells of the array of memory cells 105 may use any number of storage mediums including DRAM, FeRAM, PCM, or other types of memory cells. A DRAM memory cell may include a capacitor with a dielectric material as the insulating material. For example, the dielectric material may have linear or para-electric electric polarization properties and a ferroelectric memory cell may include a capacitor with a ferroelectric material as the insulating material. In instances where the storage medium includes FeRAM, different levels of charge of a ferroelectric capacitor may represent different logic states.

The array of memory cells 105 may be or include a three-dimensional (3D) array, where multiple two-dimensional (2D) arrays or multiple memory cells are formed on top of one another. Such a configuration may increase the number of memory cells that may be formed on a single die or substrate as compared with 2D arrays. In turn, this may reduce production costs or increase the performance of the memory array, or both. Each level of the array may be aligned or positioned so that memory cells may be approximately aligned with one another across each level, forming a memory cell stack.

In some examples, the array of memory cells 105 may include a memory cell, a word line, a digit line, and a sense component. In some examples, the array of memory cells 105 may include a plate line (e.g., in the case of FeRAM). A memory cell of the array of memory cells 105 may include a selection component and a logic storage component, such as capacitor that includes a first plate, a cell plate, a second plate, and a cell bottom. The cell plate and cell bottom may be capacitively coupled through an insulating material (e.g., dielectric, ferroelectric, or PCM material) positioned between them.

The memory cell of the array of memory cells 105 may be accessed (e.g., during a read operation, write operation, or other operation) using various combinations of word lines, digit lines, and/or plate lines. In some cases, some memory cells may share access lines (e.g., digit lines, word lines, plate lines) with other memory cells. For example, a digit line may be shared with memory cells in a same column, a word line may be shared with memory cells in a same row, and a plate line may be shared with memory cells in a same section, tile, deck, or multiple decks. As described above, various states may be stored by charging or discharging the capacitor of the memory cell.

The stored state of the capacitor of the memory cell may be read or sensed by operating various elements. The capacitor may be in electronic communication with a digit line. The capacitor may be isolated from digit line when selection component is deactivated, and capacitor can be connected to digit line when selection component is activated (e.g., by the word line). Activating selection component may be referred to as selecting a memory cell. In some cases, the selection component may be a transistor and its operation may be controlled by applying a voltage to the transistor gate, where the voltage magnitude is greater than the threshold magnitude of the transistor. The word line may activate the selection component; for example, a voltage applied to a transistor gate of a word line may connect a capacitor of a memory cell with a digit line.

The change in voltage of a digit line may, in some examples, depend on its intrinsic capacitance. That is, as charge flows through the digit line, some finite charge may be stored in the digit line and the resulting voltage depends on the intrinsic capacitance. The intrinsic capacitance may depend on physical characteristics, including the dimensions, of the digit line. The digit line may connect many memory cells of the array of memory cells 105 so digit line may have a length that results in a non-negligible capacitance (e.g., on the order of picofarads (pF)). The resulting voltage of the digit line may then be compared to a reference voltage (e.g., a voltage of a reference line) by a sense component in order to determine the stored logic state in the memory cell. Other sensing processes may be used.

The sense component may include various transistors or amplifiers to detect and amplify a difference in signals, which may be referred to as latching. The sense component may include a sense amplifier that receives and compares the voltage of the digit line and a reference line, which may be a reference voltage. The sense amplifier output may be driven to the higher (e.g., a positive) or lower (e.g., negative or ground) supply voltage based on the comparison. For instance, if the digit line has a higher voltage than reference line, then the sense amplifier output may be driven to a positive supply voltage.

In some cases, the sense amplifier may drive the digit line to the supply voltage. The sense component may then latch the output of the sense amplifier and/or the voltage of the digit line, which may be used to determine the stored state in the memory cell (e.g., logic '1'). Alternatively, for example, if the digit line has a lower voltage than reference line, the sense amplifier output may be driven to a negative or ground voltage. The sense component may similarly latch the sense amplifier output to determine the stored state in the memory cell (e.g., logic '0'). The latched logic state of the memory cell may then be output, for example, through a column decoder.

To write a memory cell, a voltage may be applied across the capacitor of the memory cell. Various methods may be used to write a memory cell. In one example, the selection component may be activated through a word line in order to electrically connect the capacitor to the digit line. A voltage may be applied across the capacitor by controlling the voltage of the cell plate (e.g., through a plate line) and the cell bottom (e.g., through a digit line). To write a logic '0', the cell plate may be taken high (e.g., a voltage level may be increased above a predetermined voltage that is a "high" voltage). That is, a positive voltage may be applied to plate line, and the cell bottom may be taken low (e.g., virtually grounding or applying a negative voltage to the digit line). The opposite process may be performed to write a logic '1', where the cell plate is taken low and the cell bottom is taken high.

The controller 110 may control the operation (e.g., read, write, re-write, refresh, precharge, etc.) of memory cells in the array of memory cells 105 through the various components (e.g., row decoders, column decoders, and sense components). In some cases, one or more of the row decoder, column decoder, and sense component may be co-located with the controller 110. Controller 110 may generate row and column address signals in order to activate the desired word line and digit line. In other examples, controller 110 may generate and control various voltages or currents used during the operation of memory device 100. For example, controller 110 may apply discharge voltages to a word line or digit line after accessing one or more memory cells. In general, the amplitude, shape, or duration of an applied voltage or current discussed herein may be adjusted or varied and may be different for the various operations discussed in operating the memory device 100. Furthermore, one, multiple, or all memory cells within the array of memory cells 105 may be accessed simultaneously. For example, multiple memory cells or all memory cells of the array of memory cells 105 may be accessed simultaneously during a reset operation in which multiple memory cells or all memory cells may be set to a single logic state (e.g., logic '0').

In some examples, at least some (and in some cases, each) of the signaling interfaces 120 may generate and/or decode signals communicated using the plurality of channels 115. A signaling interface 120 may be associated with each component that is coupled with the plurality of channels 115. The signaling interface 120 may be configured to generate and/or decode multi-level signals, binary-level signals, or both (e.g., simultaneously). Each signaling interface 120 may include a transmitter 125 and a receiver 130. In some examples, each transmitter 125 may be referred to as a multi-leg driver.

Each transmitter 125 may be configured to generate a multi-level signal based on a logic state that includes multiple bits. For example, transmitter 125 may use PAM4 signaling techniques (or other type of multi-level signaling techniques) to generate a signal having an amplitude that corresponds to the logic state. The transmitter 125 may be configured to receive data using a single input line. In some cases, the transmitter 125 may include a first input line for a first bit of data (e.g., most-significant bit), a second input line for a second bit of data (e.g., least-significant bit). In some circumstances, the transmitter 125 may be configured to generate a binary-level signal (e.g., a NRZ signal). In some cases, the transmitter 125 may use single-ended signaling to generate the multi-level signal. In such cases, the multi-level signal may be transmitted without a differential.

Each receiver 130 may be configured to determine a logic state represented by a symbol of the multi-level signal received using the plurality of channels 115. In some cases, the receiver 130 may determine an amplitude of the received multi-level signal. Based on the determined amplitude, the receiver 130 may determine the logic state represented by the multi-level signal. The receiver 130 may be configured to output data using a single output line. In some cases, receiver 130 may include a first output line for a first bit of data (e.g., most-significant bit), a second output line for a second bit of data (e.g., least-significant bit). In some circumstances, the receiver 130 may be configured to decode a binary-level signal (e.g., a NRZ signal). For example, each of receivers 130 may be coupled with a transmitter (not illustrated) via a plurality of channels 115. Each of the channels 115 may be configured to output data that includes multiple bits, and the controller 110 may be configured to determine an output impedance offset between the data output. One or more transistors (not separately illustrated) may be configured to adjust a resistance level one or more of the pluralities of channels 115. This adjustment may be based at least in part on the determined output impedance offset.

In some cases, each of the signaling interfaces 120 may be configured to selectively generate and/or decode different types of signals (e.g., NRZ signals, PAM4 signals, PAM8 signals, etc.). Different types of signals may be used based on the operational circumstances of the memory device 100. For example, binary-level signaling may use less power than multi-level signaling and may be used when power consumption is driving consideration for performance. Other performance factors that may be used to determine which type of signaling should be used may include clock considerations, data strobe (DQS) considerations, circuit capabilities, bandwidth considerations, jitter considerations, or combinations thereof. In some cases, the controller 110 may be configured to select the type of signal, and the signaling interfaces 120 may be configured to implement the selection based on instructions received from the controller 110. In some cases, each of the signaling interfaces 120 may be configured to implement coding functions such as error detection procedures, error correction procedures, data bus inversion procedures, or combinations thereof.

In some cases, the signaling interfaces 120 may be configured to communicate multi-level signals and binary-level signals simultaneously. In such cases, a signaling interface 120 may include more than one set of transmitters 125 and receivers 130. For example, a signaling interface 120 may be configured to communicate a first set of data (e.g., a control signal) using a binary-level signal using a first set of channels 115 at the same time that a second set of data (e.g., user information) is being communicated using a multi-level signal using a second set of channels 115.

Figure 2:
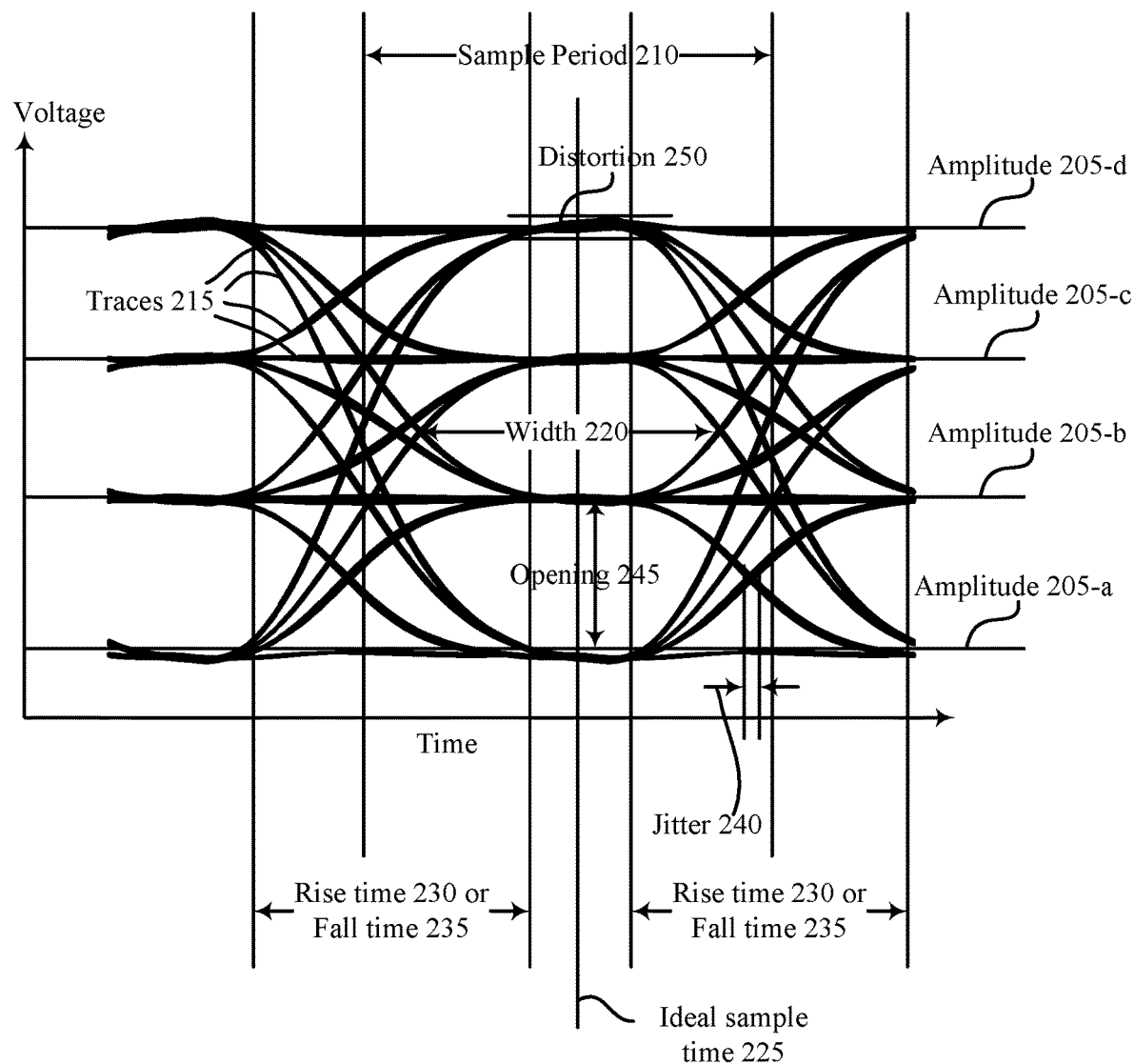
FIG. 2 illustrates an example of an eye diagram that supports channel equalization for multi-level signals in accordance with various aspect of the present disclosure.

FIG. 2 illustrates an example of an eye diagram 200 representing a multi-level signal in accordance with various embodiments of the present disclosure. The eye diagram 200 may be used to indicate the quality of signals in high-speed transmissions and may represent four symbols of a signal (e.g., '00', '01', '10', or '11'). In some examples, each of the four symbols may be represented by a different voltage amplitude (e.g., amplitudes 205-a, 205-b, 205-c, 205-d). In other examples, the eye diagram 200 may represent a PAM4 signal that may be used to communicate data in a memory device (e.g., memory device 100 as described with reference to FIG. 1). The eye diagram 200 may be used to provide a visual indication of the health of the signal integrity, and may indicate noise margins of the data signal. The noise margin may, for example, refer to an amount by which the signal exceeds the ideal boundaries of the amplitudes 205.

To generate the eye diagram 200, an oscilloscope or other computing device may sample a digital signal according to a sample period 210 (e.g., a unit interval or a bit period). The sample period 210 may be defined by a clock associated with the transmission of the measured signal. In some examples, the oscilloscope or other computing device may measure the voltage level of the signal during the sample period 210 to form a trace 215. Noise and other factors can result in the traces 215 measured from the signal deviating from a set of ideal step functions. By overlaying a plurality of traces 215, various characteristics about the measured signal may be determined. For example, the eye diagram 200 may be used to identify a number of characteristics of a communication signals such as jitter, cross talk, electromagnetic interference (EMI), signal loss, signal-to-noise ratio (SNR), other characteristics, or combinations thereof. A closed eye may indicate a noisy and/or unpredictable signal or other problems.

In some examples, the eye diagram 200 may indicate a width 220. The width 220 of an eye in the eye diagram 200 may be used to indicate a timing synchronization of the measured signal or jitter effects of the measured signal. In some examples, comparing the width 220 to the sample period 210 may provide a measurement of SNR of the measured signal. Each eye in an eye diagram may have a unique width based on the characteristics of the measured signal. Various encoding and decoding techniques may be used to modify the width 220 of the measured signal.

In other examples, the eye diagram 200 may indicate a sampling time 225 (e.g., an ideal sampling time) for determining the value of a logic state represented by a symbol of the measured signal. For example, determining a correct time for sampling data (e.g., timing synchronization) of the measured signal may be important to minimize the error rate in detection of the signal. For example, if a computing device samples a signal during a transition time (e.g., a rise time 230 or a fall time 235), errors may be introduced by the decoder into the data represented by a symbol of the signal. Various encoding and decoding techniques may be used to modify the ideal sampling time 225 of the measured signal.

The eye diagram 200 may be used to identify a rise time 230 and/or a fall time 235 for transitions from a first amplitude 205 to a second amplitude 205. The slope of the trace 215 during the rise time 230 or fall time 235 may indicate the signal's sensitivity to timing error, among other aspects. For example, the steeper the slope of the trace 215 (e.g., the smaller the rise time 230 and/or the fall times 235), the more ideal the transitions between amplitudes 205 are. Various encoding and decoding techniques may be used to modify the rise time 230 and/or fall time 235 of the measured signal.

In some examples, the eye diagram 200 may be used to identify an amount of jitter 240 in the measured signal. Jitter 240 may refer to a timing error that results from a misalignment of rise and fall times. Jitter 240 occurs when a rising edge or falling edge occurs at a time that is different from an ideal time defined by the data clock. Jitter 240 may be caused by signal reflections, intersymbol interference, crosstalk, process-voltage-temperature (PVT) variations, random jitter, additive noise, or combinations thereof. Various encoding and decoding techniques may be used to modify the jitter 240 of the measured signal. In some cases, the jitter 240 for each signal level or each eye may be different.

In other examples, the eye diagram 200 may indicate an eye opening 245, which may represent a peak-to-peak voltage difference between the various amplitudes 205. The eye opening 245 may be related to a voltage margin for discriminating between different amplitudes 205 of the measured signal. The smaller the margin, the more difficult it may be to discriminate between neighboring amplitudes, and the more errors that may be introduced due to noise. In some cases, a receiver (e.g., receiver 130 as described with reference to FIG. 1) of the signal may compare the signal to one or more threshold voltages positioned between the various amplitudes 205. In other cases, the larger the eye opening 245, the less likely it is that noise will cause the one or more voltage thresholds to be satisfied in error. The eye opening 245 may be used indicate an amount of additive noise in the measured signal, and may be used to determine a SNR of the measured signal. Various encoding and decoding techniques may be used to modify the eye opening 245 of the measured signal. In some cases, the eye opening 245 for each eye may be different. In such cases, the eyes of the multi-level signal may not be identical.

In other examples, the eye diagram 200 may indicate distortion 250. The distortion 250 may represent overshoot and/or undershoot of the measured signal due to noise or interruptions in the signal path. As a signal settles into a new amplitude (e.g., amplitude 205-$b$) from an old amplitude (e.g., an amplitude 205-$c$), the signal may overshoot and/or undershoot the new amplitude level. In some examples, distortion 250 may be caused by this overshooting and/or undershooting, and may be caused additive noise in the signal or interruptions in the signal path. Each eye in an eye diagram may have a unique opening based on the characteristics of the measured signal. Various encoding and decoding techniques may be used to modify the distortion 250 of the measured signal. In some cases, the distortion 250 for each signal level or each eye may be different.

The locations of the characteristics of the eye diagram 200 shown in FIG. 2 are for illustrative purposes only. Characteristics such as width 220, sampling time 225, rise time 230, fall time 235, jitter 240, eye opening 245, and/or distortion 250 may occur in other parts of the eye diagram 200 not specifically indicated in FIG. 2.

According to the techniques described herein, channel equalization (e.g., de-emphasis, pre-emphasis, FFE, etc.) may be applied to multi-level signals to compensate for the above-described negative effects.

Figure 3:
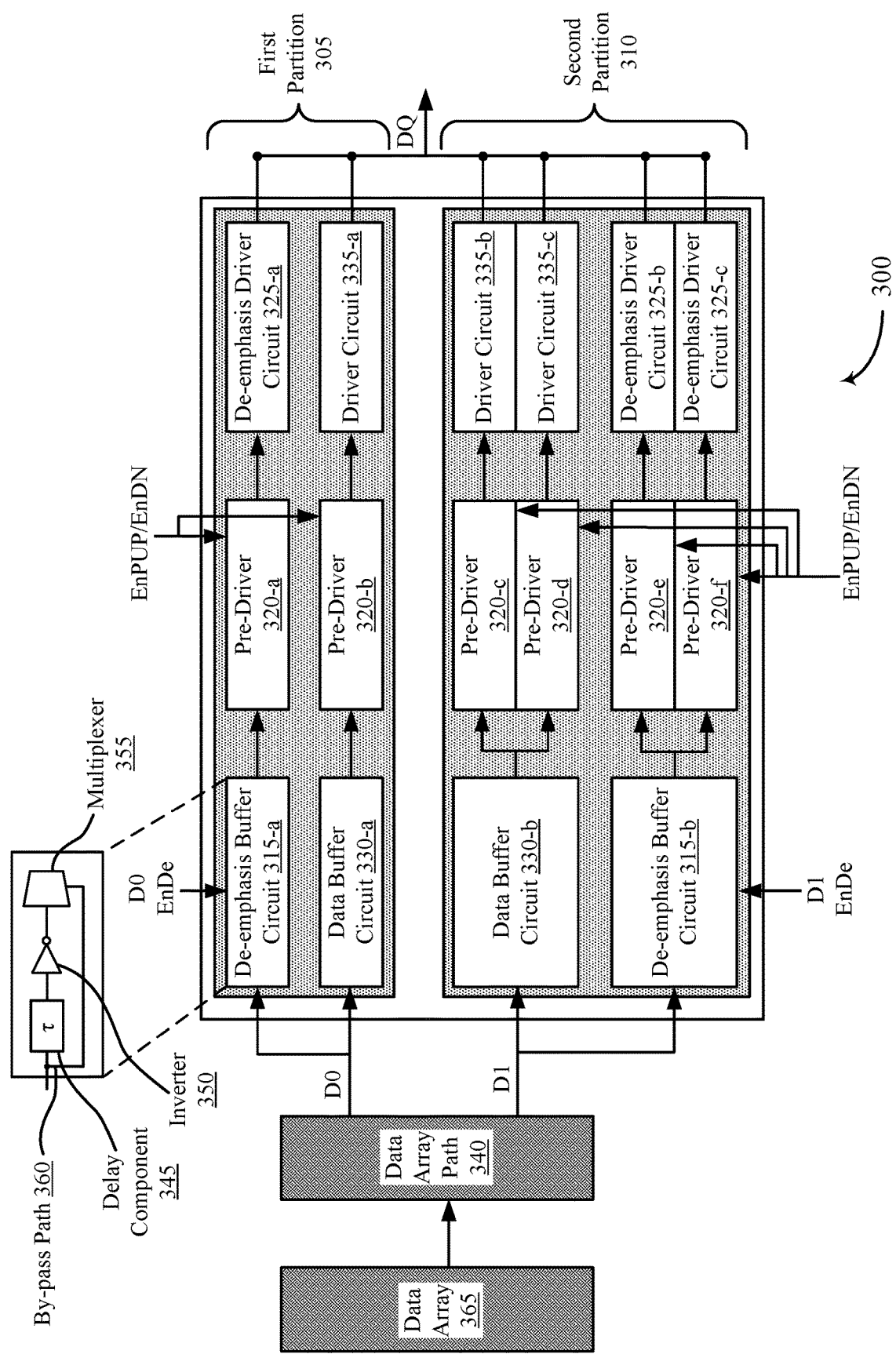
FIG. 3 illustrates an example of a multi-level signal transmitter that supports channel equalization for multi-level signals in accordance with various aspect of the present disclosure.

FIG. 3 illustrates a multi-level signal transmitter 300 that supports channel equalization for multi-level signaling in accordance with examples of the present disclosure. Transmitter 300 may be part of a signaling interface 120 as described with reference to FIG. 1 (e.g., transmitter 300 may be part of a transmitter 125). The transmitter 300 may also be referred to herein as an apparatus. Transmitter 300 may include two partitions: a first partition 305, which includes the components and data path for one bit (e.g., the least significant bit (LSB)) in a multi-level signal (e.g., a PAM4 symbol), and a second partition 310, which includes the components and data path for a second bit (e.g., the most significant bit (MSB)) in the multi-level signal (e.g., the PAM4 symbol). Each partition may be connected to a different data line (e.g., first partition 305 may be in electronic communication with data line D0 and second partition 310 may be in electronic communication with data line D1).

The first and second partitions may output signals that can be combined (e.g., summed or superimposed) to create a PAM4 symbol (e.g., a PAM4 symbol that is part of a multi-level signal). The first partition 305 may correspond to the LSB in a PAM4 symbol and may be configured to drive the DQ level with one amplitude when the LSB is 1 and another amplitude when the LSB is 0. For example, when the LSB is 1, the first partition may be configured to provide or output a signal that ultimately boosts the resulting symbol by a predetermined amount (e.g., the amount necessary to distinguish amplitude 205-$b$ from amplitude 205-$a$ in FIG. 2). Similarly, the second partition 310 may correspond to the MSB in a PAM4 symbol and may be configured to drive the DQ level with one amplitude when the MSB is 1 and another amplitude when the MSB is 0. For example, when the MSB is 1, the second partition 310 may be configured to provide or output a signal that ultimately boosts the resulting symbol by a predetermined amount (e.g., the amount necessary to distinguish amplitude 205-$d$ from amplitude 205-$b$ in FIG. 2).

Thus, the DQ levels output by the partitions when the corresponding bits are '1' may vary. For example, the first partition 305 may drive the DQ level to an amplitude that corresponds to half of the MSB and the second partition may drive the DQ level to an amplitude that corresponds to the MSB. So a PAM4 symbol may be generated by adding the LSB to the MSB. In such a scenario, the second partition 310 may be configured to drive the DQ level to twice the amplitude output by the first partition 305, which may be achieved by using twice as many components (e.g., twice as many pre-drivers and driver circuits) in the second partition 310 compared to the first partition 305. Although such a configuration is shown if FIG. 3, the techniques described herein are compatible with alternative configurations.

The transmitter may also include, or be in electronic communication with, a data array path 340. Data from a data array (e.g., data array 365) may be passed to one or more components of transmitter 300 via the data array path 340, which may include one or more sense amplifiers, data lines, data latches, multiplexing circuits, or serialization circuits. So data (e.g., one or more data signals or bits) may be transferred from the data array 365 to the first partition 305 and the second partition 310 via data array path 340.

Each partition may include a main data path and a channel equalization path (e.g., a de-emphasis or pre-emphasis path). When de-emphasis is used, a channel equalization path may include at least one de-emphasis buffer circuit 315, pre-driver circuit 320, and de-emphasis driver circuit 325-$a$. When pre-emphasis is used, a channel equalization path may include at least one pre-emphasis buffer circuit, pre-driver circuit, and pre-emphasis driver circuit. As referred to herein, a channel equalization buffer may refer to a buffer than facilitates channel equalization (e.g., by generating signals to control the channel equalization). So a channel equalization buffer may refer to a de-emphasis buffer circuit or a pre-emphasis buffer circuit.

A main data path may include at least one data buffer circuit 330, pre-driver circuit 320, and driver circuit 335. According to the techniques described herein, a first data signal (e.g., a first bit, or stream of bits) may be transferred from the data array path 340 to de-emphasis buffer circuit 315-$a$ and data buffer circuit 330-$a$. The first data signal may be transferred over the first data line D0. A second data signal (e.g., a second bit or stream of bits) may be transferred from the data array path 340 to de-emphasis buffer circuit 315-$b$ (or, in pre-emphasis implementations, pre-emphasis buffer circuit 315-$b$) and data buffer circuit 330-$b$. In some cases, data buffer circuit 330-$b$ may be made up of a pair of data buffers.

The data buffer circuits 330 may temporarily store the received data signals before transferring them to the pre-drivers 320. Thus, the signal output by the data buffer circuits 330 may be a delayed version of the data signal received from the data array path 340. The duration of time by which the data signal is delayed may be referred to herein as the data buffer delay. The data buffer delay may be less than the delay introduced by the de-emphasis (or pre-emphasis) buffer circuits 315. The data buffer circuits 330 may include a number of transistors configured so that the voltage and current of the signal output by the data buffer circuits matches the voltage and current of the input signal. Here, data buffer circuit 330-$a$ may transfer the first data signal to pre-driver 320-$b$ and data buffer circuit 330-$b$ may transfer the second data signal to pre-driver 320-c and pre-driver 320-d. Although a single data buffer circuit 330-a and data buffer circuit 330-b are shown, transmitter 300 may include multiple data buffer circuits 330-a and multiple data buffer circuits 330-b.

The de-emphasis buffer circuits 315 may generate de-emphasis control signals based on the received data signals and transfer the control signals to the pre-drivers 320. Similarly, when a pre-emphasis implementation is used, pre-emphasis buffer circuits 315 may generate pre-emphasis control signals based on the received data signals and transfer the control signals to the pre-drivers 320. The de-emphasis (or pre-emphasis) control signals may then be propagated through the pre-drivers 320 (possibly after some modification) to the final drivers (e.g., de-emphasis or pre-emphasis driver circuits 325). Based on the control signals, the de-emphasis driver circuits 325 (or pre-emphasis driver circuits 325) may generate, drive, output, or modify a signal that de-emphasizes (or pre-emphasizes) the final output signal. So when a buffer circuit 315 generates a de-emphasis control signal, the buffer circuit 315 is modifying (e.g., delaying and inverting) a data signal to control the de-emphasis or pre-emphasis of signal output by transmitter 300. Thus, the buffer circuits 315 may generate proper control signals for de-emphasis based on the input data signal.

Generally, "de-emphasis" means reducing a signal amplitude after a transition of the signal. De-emphasis in this context can be accomplished by reducing the low frequency components of the signal, which decreases the overall amplitude of the signal. For instance, the low frequency components of a signal can be reduced after transition of the signal by adding an inverted and delayed version of the signal to the original signal. As used herein, "de-emphasis" may also refer to manipulating a signal so that when it is added to the original signal, the resulting signal is de-emphasized in the first sense of the word.

According to the techniques described herein, de-emphasis buffer circuit 315-a may modify (e.g., delay and invert) the first data signal received from data array path 340 (e.g., over first data line D0) and de-emphasis buffer circuit 315-b may modify (e.g., delay and invert) the second data signal received from data array path 340 (e.g., over second data line D1). The modified data signals may serve as control signals as described above. For example, the first control signal may control the de-emphasis applied by de-emphasis driver circuit 325-a and the second control may control the de-emphasis applied by de-emphasis driver circuit 325-b. The delay $\tau$ can be used to determine how long the de-emphasis lasts (e.g., for a full UI, for a fraction of a UI) and the ratio between each de-emphasis driver circuit 325 and its corresponding driver circuit 335 may determine the amplitude of the equalization. The amount of delay and the scaling factor used in the de-emphasis may be referred to herein as the de-emphasis adjustment. So the de-emphasis adjustment may be controlled by the control signals passed from the de-emphasis buffer circuits 315 to the de-emphasis driver circuits 325. Based on these control signals, de-emphasis driver circuit 325-a may apply a first de-emphasis adjustment to the first data signal and de-emphasis driver circuit 325-b may apply a second de-emphasis adjustment to the second data signal. A similar process may be used in the pre-emphasis implementation. For example, in some cases, the de-emphasis buffer circuits 315 are pre-emphasis buffer circuits that pre-emphasize received data signals or FFE components that shape received signals based on the channel response.

As noted, de-emphasizing a signal may include suppressing low-frequency components of the signal to compensate for degradation of the signal's high-frequency components due to channel loss. Pre-emphasizing a signal may include boosting the high-frequency components of the signal to compensate for attenuation incurred in the channel. The de-emphasis buffer circuits 315 may include a delay component 345, an inverter 350, and a multiplexer 355. The delay component 345 may receive the data signal from the data array path 340 and delay it for a delay of $\tau$. The delay $\tau$ may be selected so that the propagation delay through the de-emphasis buffer circuit 315-a represents how long the de-emphasis would last. The inverter 350 may receive the delayed data signal, invert it, and pass the inverted signal to the multiplexer 355.

The multiplexer 355 may activate and deactivate (e.g., turn on and off) the de-emphasis buffer circuit 315-a, as controlled by a select signal EnDe. There may be a select signal EnDe for each pre-emphasis or de-emphasis buffer circuit (e.g., a first select signal D0 EnDe for de-emphasis buffer circuit 315-a and a second select signal D1 EnDe for de-emphasis buffer circuit 315-b). The select signals D0 EnDe and D1 EnDe, also referred to as enable signals D0 EnDe and D1 EnDe, may convey different control information so that the de-emphasis buffer circuits 315 (or pre-emphasis buffer circuits 315) can be activated independently.

When a de-emphasis buffer circuit 315-a is enabled or activated, the data signal may pass through the delay component 345 and the inverter 350. When the de-emphasis buffer circuit 315-a is de-activated, the data signal may by-pass the delay component 345 and the inverter 350 (e.g., by taking by-pass path 360). As discussed above, the delayed and inverted data signal may control de-emphasis, which may increase the detectability of a multi-level signal at a receiver. De-emphasis buffer circuit 315-b may be implemented in a similar fashion as de-emphasis buffer circuit 315-a. Although a single de-emphasis buffer circuit 315-a and de-emphasis buffer circuit 315-b are shown, transmitter 300 may include multiple de-emphasis buffer circuits 315-a and multiple de-emphasis buffer circuits 315-b.

As described above, de-emphasis buffer circuit 315-a may transfer the first control signal to pre-driver 320-a and de-emphasis buffer circuit 315-b may transfer the second control signal to pre-driver 320-c and pre-driver 320-d. The pre-drivers 320 may condition or modify the received control signals before passing them to their respective driver circuits (e.g., the pre-driver circuits 320 may modify the signals output by the de-emphasis driver circuits 325 to improve the characteristics or quality of the communication signal). The pre-drivers 320 may additionally or alternatively act as selectors. For example, each pre-driver circuit 320 may select and control the corresponding driver circuit. The pre-driver circuits 320 in turn may be controlled by select signals such as EnPUP/EnDN, which may activate the pre-driver circuits 320 and control which driver circuits are selected.

Although a single pre-driver circuit 320 is shown for each data path, there may be multiple pre-driver circuits 320 per data path. For example, each data path may include two pre-driver circuits, one of which is a pull-up pre-driver circuit and one of which is a pull-down pre-driver circuit. Thus, the pre-driver circuits 320 may be pull-up or pull-down pre-driver circuits.

Each pre-driver 320 may transfer or output a modified version of its input signal to a driver circuit. For example, pre-driver 320-a may transfer a modified version of the delayed and inverted first data signal (e.g., a first de-emphasis control signal) to de-emphasis driver circuit 325-a and pre-driver 320-b may transfer a modified version of the first data signal (e.g., a first driver control signal) to driver circuit 335-a. Similarly, pre-driver 320-e may transfer a modified version of the delayed and inverted second signal (e.g., a second de-emphasis control signal) to de-emphasis driver circuit 325-b and pre-driver 320-f may transfer a modified version of the delayed and inverted second signal (e.g., a third de-emphasis control signal) to de-emphasis driver circuit 325-c. Pre-driver 320-c may transfer a modified version of the second data signal (e.g., a second driver control signal) to driver circuit 335-b and pre-driver 320-d may transfer a modified version of the second data signal (e.g., a third driver control signal) to driver circuit 335-c. A modified version of a signal sent though the paths corresponding to data buffer circuits 330 may not be inverted or delayed. Although described with reference to de-emphasis, the transfer of signals in transmitter 300 may be similar for pre-emphasis implementations.

De-emphasis driver circuits 325 and driver circuits 335 may increase or decrease the drive strength (e.g., voltage or current) of output signals based on the control signals they receive from the pre-drivers 320. For example, de-emphasis driver circuit 325-a (or pre-emphasis driver circuit 325-a) may increase or decrease the drive strength of its output signal based at least in part on the first control signal received from pre-driver 320-a. When a de-emphasis driver circuit is used, the drive strength of the output signal may be reduced. When a pre-emphasis driver circuit is used, the drive strength of the output signal may be increased. The outputs of driver circuits 325 and driver circuits 335 may be combined (e.g., superimposed) to create a de-emphasized or pre-emphasized symbol, represented by DQ.

For instance, de-emphasis driver circuit 325-a may be configured to drive a signal that is delayed and inverted compared to the signal output by driver circuit 335-a. When the signal output by de-emphasis driver circuit 325-a is combined with the signal output by driver circuit 335-a, the resulting signal represents the LSB but includes low frequency components that have been decreased compared to the other frequency components (e.g., to compensate for the anticipated loss in high frequency components over the channel). Similarly, the de-emphasis driver circuits 325-b and 325-c may be configured to drive signals that are delayed and inverted compared to the signals output by the driver circuits 335-b and 335-c. When the signals output by de-emphasis driver circuits 325-b and 325-c are combined with the signals output by driver circuits 335-b and 335-c, the resulting signal represents the MSB but includes low frequency components that have been reduced compared to the other frequency components (e.g., to compensate for the anticipated loss in high frequency components over the channel).

The combination of all the signals output by the de-emphasis driver circuits 325 and driver circuits 335 may represent a de-emphasized PAM4 symbol. Similarly, the combination of all the signals output by the pre-emphasis driver circuits 325 and driver circuits 335 may represent a pre-emphasized PAM4 symbol. The symbol may represent or convey the first data signal (e.g., the logic state associated with the first data signal, such as the LSB) and the second data signal (e.g., the logic state associated with the second data signal, such as the MSB) such as described in FIGS. 1 and 2. Thus, transmitter 300 may generate multi-level signals that include multiple superimposed signals (e.g., the first data signal and the second data signal represented by a single symbol). As described herein, the multi-level signal may be modulated using a modulation scheme having at least three levels.

Although a single driver circuit 335 and de-emphasis driver circuit 325 is shown for each data path, there may be multiple driver circuits 335 and multiple de-emphasis (or pre-emphasis) driver circuits 325 per data path. For example, there may be multiple pre-driver circuits 320 and a driver circuit 335 or de-emphasis driver circuit 325 for each pre-driver circuit 320. A driver circuit 335 and a de-emphasis driver circuit 325 may be a pull-up driver circuit or a pull-down driver circuit. For example, a pull-up driver circuit may be used in conjunction with a pull-up pre-driver circuit and a pull-down driver circuit may be used in conjunction with a pull-down driver circuit. In some cases, the de-emphasis driver circuits 325 are or include pre-emphasis driver circuits or FFE driver circuits, which are configured to receive (and modify the strength of) signals pre-emphasized by a pre-emphasis buffer circuit (or shaped by an FFE circuit).

Although described in the context of de-emphasis, channel equalization as described herein can also be achieved via pre-emphasis. Generally, "pre-emphasis" means increasing a signal amplitude after a transition of the signal. Pre-emphasis in this context can be accomplished by amplifying the high frequency components of the signal (e.g., increasing the energy content of the high frequency components to compensate for degradation of those components due to channel loss), which increases the overall amplitude of the signal. For instance, the high frequency components of a signal can be amplified after transition of the signal by adding an inverted and delayed version of the signal to the original signal. As used herein, "pre-emphasis" may also refer to manipulating a signal so that when it is added to the original signal, the resulting signal is pre-emphasized in the first sense of the word.

To effectuate pre-emphasis in transmitter 300, the de-emphasis buffer circuits 315 may be replaced with pre-emphasis buffer circuits 315 and the de-emphasis drivers 325 may be replaced by pre-emphasis drivers 325. Similar to the de-emphasis buffer circuits, the pre-emphasis buffer circuits may generate control signals that control the behavior of their associated pre-emphasis driver circuits. The control signals may be pulses that have widths shorter than the input data signals, and that are inverted and delayed versions of the input data signals.

To generate such control signals, the pre-emphasis buffer circuit may be configured differently than the de-emphasis buffer circuits shown in transmitter 300. For example, the pre-emphasis buffer circuits may not include a multiplexer 355 or a by-pass path 360. Also, each pre-emphasis buffer circuit may include a pulse generator circuit (e.g., an AND gate at the output of the pre-emphasis buffer circuit). The inputs of the pulse generator may be the enable signal (e.g., EnDe) and a delayed and inverted version of a data signal received by the pre-emphasis buffer circuit. When disabled, the pre-emphasis buffer circuits, pre-driver circuits, and pre-emphasis driver circuits, may be turned off. This is contrary to the de-emphasis implementation, where disabling the de-emphasis buffer circuits, pre-driver circuits, and de-emphasis driver circuits does not turn them off.

The pre-emphasis driver circuits used in the pre-emphasis implementation may be the same as the de-emphasis driver circuits used in the de-emphasis implementation. Alternatively, the pre-emphasis driver circuits may be different than the de-emphasis driver circuits (e.g., to prevent the control pulse from getting attenuated as it propagates through the pre-driver circuits). In one pull-down driver example, a pre-emphasis driver circuit may include two NMOS devices in serial. One NMOS device may be controlled by an enable signal and the other may be controlled by the delayed and inverted version of the data signal output by the pre-emphasis buffer circuits. When such a configuration is used, the pre-emphasis buffer circuits may not include an AND gate.

Figure 4:
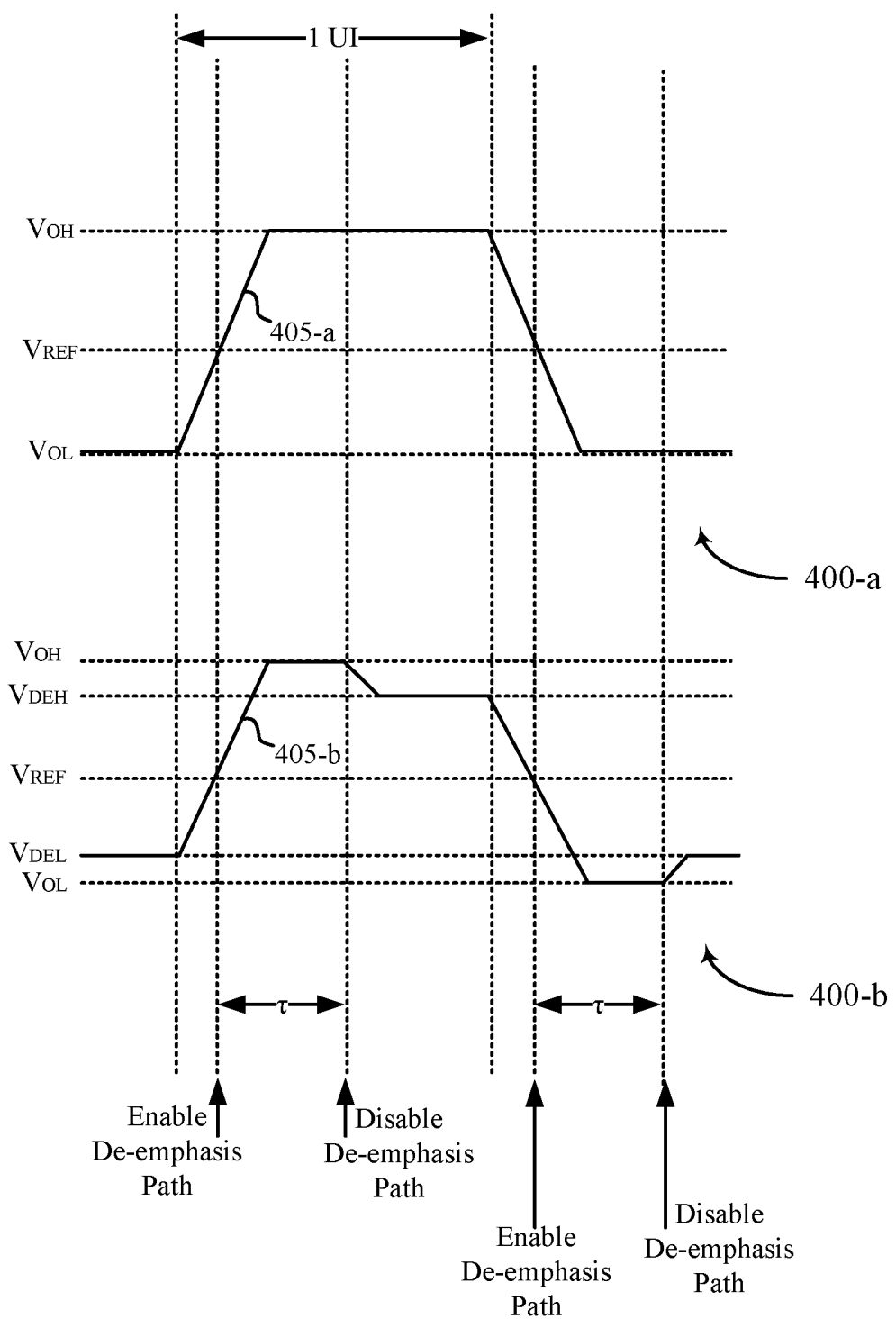
FIG. 4 illustrates plots of multi-level signals in accordance with various aspect of the present disclosure.

FIG. 4 illustrates plots 400 of multi-level signals 405 generated by a multi-level signal transmitter. The transmitter may be an example of the transmitter 300 described with reference to FIG. 3 and the signals 405 may be examples of PAM4 symbols, DQ, output by the transmitter 300. Plot 400-a represents a multi-level signal 405-a that is generated without using de-emphasis and plot 400-b represents a multi-level signal 405-b that is generated using de-emphasis. Both plots 400 show the multi-level signals 405 transitioning from a low output voltage level ($V_{OL}$) to a high output voltage level (VOH) and back to the low output voltage level $V_{OL}$. The low output voltage level $V_{OL}$ may be low compared to the reference voltage signal $V_{REF}$ and the high voltage level $V_{OL}$ may be high compared to the reference voltage signal $V_{REF}$. The high voltage level $V_{OH}$ may be associated with a first symbol value (e.g., 0b11) and the low voltage level $V_{OL}$ may be associated with a second symbol value (e.g., 0b10). Although only one set of $V_{OH}/V_{REF}/V_{OL}$ is shown, three different sets of $V_{OH}/V_{REF}/V_{OL}$ may be used in multi-level signaling (i.e., two signaling levels are shown instead of four.

As shown in FIG. 4, the signal 405 may transition from below $V_{REF}$ to $V_{OH}$. Upon this transition (e.g., upon detection of the $V_{REF}$ crossing), de-emphasis may be enabled for signal 405-b (but not for signal 405-a). For example, a de-emphasis buffer circuit 315 may be enabled as described with reference to FIG. 3. However, the de-emphasis may not be applied until expiration of τ, which is the delay associated with the corresponding delay component 345. So disabling of the de-emphasis buffer circuit 315 may coincide with application of the de-emphasis due to the delay τ. Here, τ is a fraction of a UI. However, in some cases τ is a full UI. Although a UI is shown extending from the beginning of one transition to the beginning of the subsequent transition, a UI may be defined by a different period of time. When de-emphasis is applied, the amplitude of signal 405-b may decrease from $V_{OH}$ to de-emphasized amplitude $V_{DEH}$ due to the suppression of low-frequency components. This is unlike signal 405-a, which stays at $V_{OH}$ until the next transition.

De-emphasis for signal 405-b may be enabled again when signal 405-b crosses $V_{REF}$ during the next transition. But again, because the de-emphasis buffer circuit introduces 315 a delay τ, de-emphasis is not applied until after τ time has elapsed. At this point, the de-emphasis buffer circuit may also be disabled. When de-emphasis is applied, the amplitude of signal 405-b may increase from $V_{OL}$ to de-emphasized amplitude $V_{DEL}$ due to the suppression of low-frequency components (i.e., the absolute magnitude of signal 405's amplitude may decrease, just like when de-emphasis was applied to the signal 405 at $V_{OH}$). This is unlike signal 405-a, which stays at $V_{OL}$ until the next transition. So when de-emphasis is used, the amplitude of signal 405-b may start at $V_{OH}$ or $V_{OL}$ before settling at a lower amplitude (compared to $V_{OH}$ or $V_{OL}$). When pre-emphasis is used, however, the amplitude of signal 405-b may temporarily shoot past $V_{OH}$ or $V_{OL}$ (e.g., during a transition) before settling at $V_{OH}$ or $V_{OL}$. The amount of time the amplitude exceeds $V_{OH}$ or $V_{OL}$ may be equal to the time delay τ. And the amount by which the amplitude exceeds $V_{OH}$ or $V_{OL}$ may be determined by the pre-emphasis drivers, as controlled by the pre-emphasis buffer circuits.

De-emphasizing or pre-emphasizing a signal may improve the integrity of the signal, which may increase the likelihood that a receiver is able to successfully receive and decode the signal. Such improvements can readily be seen in an eye diagram comparison.

Figure 5:
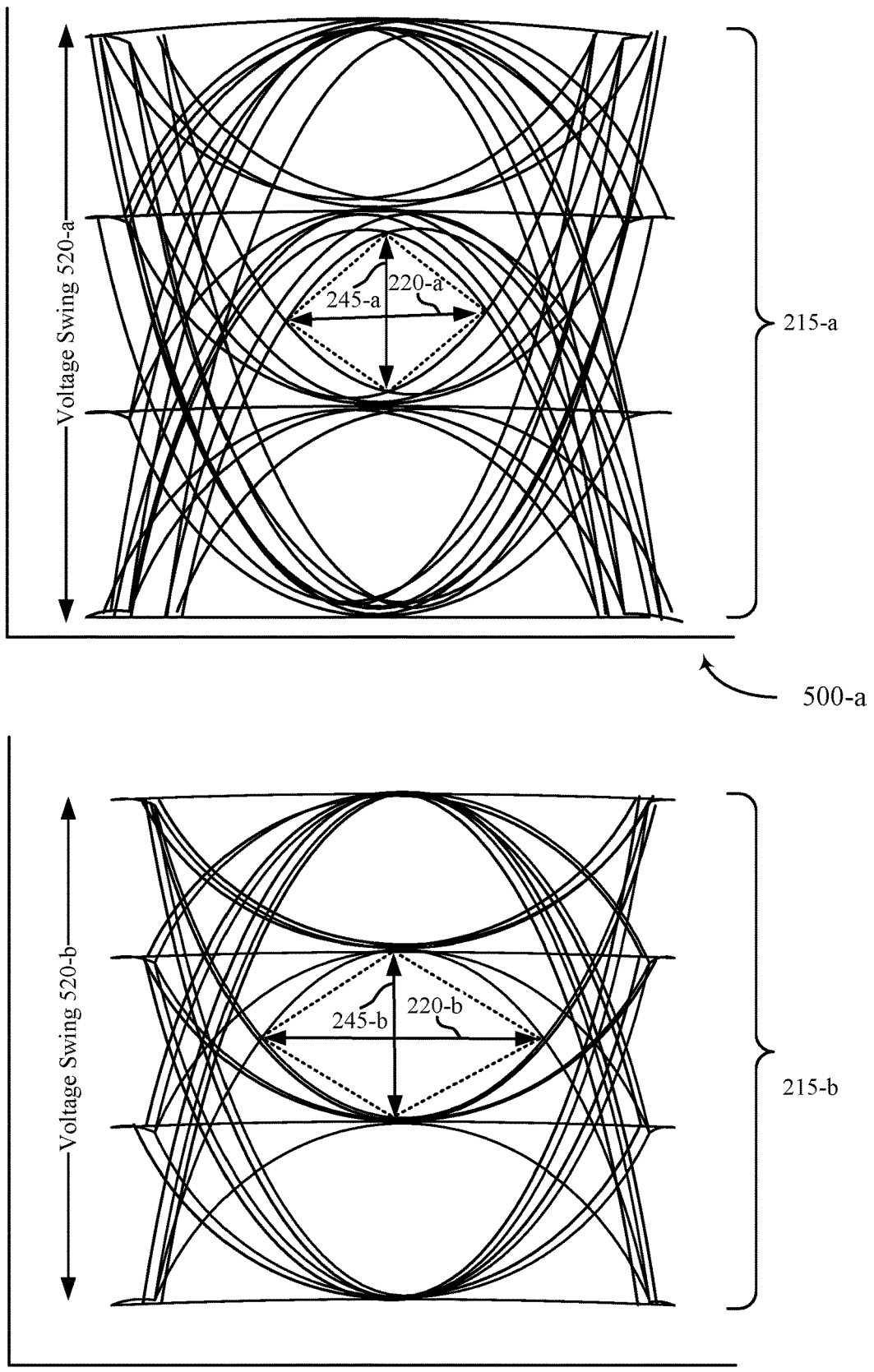
FIG. 5 illustrates examples of eye diagrams that support channel equalization for multi-level signals in accordance with various aspect of the present disclosure.

FIG. 5 illustrates eye diagrams of multi-level signals received from a transmitter. The transmitter may be an example of the transmitter 300 described with reference to FIG. 3 and the signals may be examples of PAM4 symbols output by the transmitter 300. Eye diagram 500-a represents traces 215-a of PAM4 signals generated without using de-emphasis and eye diagram 500-b represents traces 215-b of PAM4 signals generated using de-emphasis (e.g., using de-emphasis buffer circuits 315), pre-emphasis, or FFE. As can be seen in FIG. 5, the eye opening 245-a, which represents the voltage margin between levels, is smaller than the eye opening 245-b. And the eye width 220-a, which represents the timing margin between levels, is smaller than the eye width 220-b. As discussed in FIG. 2, smaller eye openings and eye widths indicate that the PAM4 signals are subject channel losses that decrease the likelihood that the receiver will reliably capture the data conveyed by the PAM4 signals.

Here, the eyes for traces 215-b are larger than the eyes for traces 215-a due to the effects of de-emphasis; the suppression of lower frequencies by de-emphasis buffer circuits 315 compensates for the suppression of higher frequencies by the non-ideal channel, which results in lower signal amplitudes in the time domain. The effects of de-emphasis are also manifest in the voltage swing; due to the overall reduction in signal amplitudes, the voltage swing 520-b for traces 215-b is smaller than the voltage swing 520-a for traces 215-a. Regardless, the increase in eye opening 245-b and eye width 220-b enables a receiver to more reliably receive and process the traces 215-b compared to the traces 215-a. Although described with reference to PAM4 signals, the techniques described herein can be used for higher level signaling (e.g., PAM8, etc.).

Figure 6:
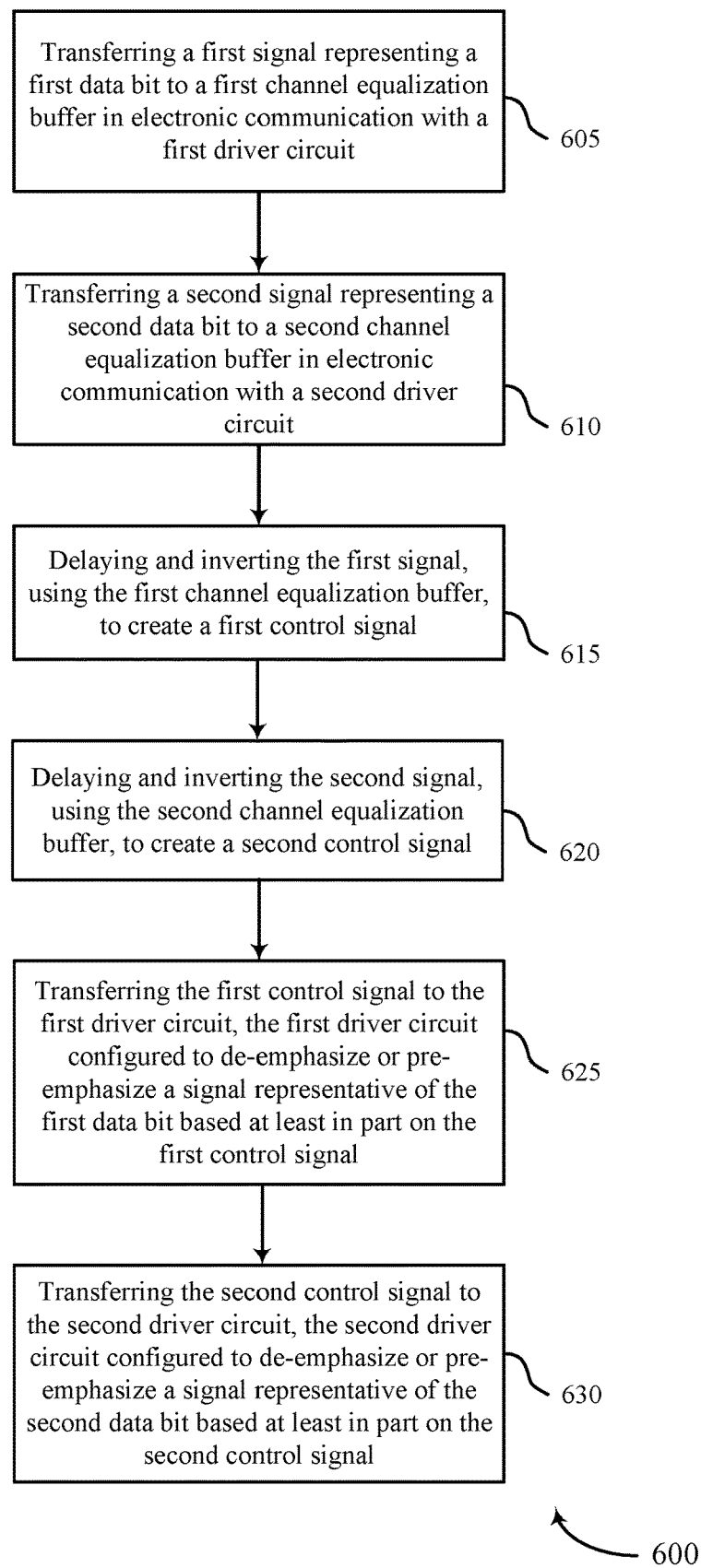
FIG. 6 shows a flowchart illustrating a method of channel equalization for multi-level signals in accordance with various aspect of the present disclosure.

FIG. 6 shows a flowchart illustrating a method 600 that supports channel equalization for multi-level signaling in accordance with aspects of the present disclosure. The operations of method 600 may be implemented by a transmitter or its components as described herein. For example, the operations of method 600 may be performed by a transmitter as described with reference to FIG. 3.

At 605 the transmitter may transfer a first signal representing a first data bit (e.g., a MSB or LSB) to a first channel equalization buffer in electronic communication with a first driver circuit. The first channel equalization buffer may be a de-emphasis buffer circuit or a pre-emphasis buffer circuit. At 610, the transmitter may transfer a second signal representing a second data bit (e.g., a LSB if the first signal is an MSB, or an MSB if the first signal is an LSB) to a second channel equalization buffer in electronic communication with a second driver circuit. The second channel equalization buffer may be a de-emphasis buffer circuit or a pre-emphasis buffer circuit. At 615 the transmitter may delay and invert the first signal, using the first channel equalization buffer, to create a first control signal. At 620, the transmitter may delay and invert the second signal, using the second channel equalization buffer, to create a second control signal. At 625, the transmitter may transfer the first control signal from the first channel equalization buffer to the first driver circuit. The first driver circuit may be configured to de-emphasize, or pre-emphasize, a signal representative of the first data bit based at least in part on the first control signal. At 625, the transmitter may transfer the second control signal from the second channel equalization buffer to the second driver circuit. The second driver circuit may be configured to de-emphasize, or pre-emphasize, a signal representative of the second data bit based at least in part on the second control signal.

In some cases, the method includes generating a symbol of a multi-level signal based at least in part on the signal de-emphasized or pre-emphasized by the first driver circuit and the signal de-emphasized or pre-emphasized by the second driver circuit. The symbol may represent the first data bit and the second data bit. In some cases, transferring the first control signal includes modifying the first control signal using a first pre-driver circuit in electronic communication with the first channel equalization buffer and the first driver circuit; and transferring the modified first control signal from the first pre-driver circuit to the first driver circuit. In some cases, transferring the second control signal includes modifying the second control signal using a second pre-driver circuit in electronic communication with the second channel equalization buffer and the second driver circuit; and transferring the modified second control signal from the second pre-driver circuit to the second driver circuit.

In some cases, the method includes modifying the delayed and inverted first signal using the first pre-driver circuit; and transferring the modified delayed and inverted first signal from the first pre-driver circuit to a first driver circuit. The method may also include receiving a control signal, from a controller, at the first pre-driver circuit, and transferring the modified delayed and inverted first signal to the first driver circuit based on the control signal. In some cases, the method includes receiving a control signal (e.g., a select or enable signal) from a controller at the first channel equalization buffer. The control signal may trigger delaying and inverting the first signal.

Thus, a transmitter may enable de-emphasis or pre-emphasis of multi-level signals. According to the techniques described herein, a transmitter may include a first pre-driver circuit that includes a first input coupled with a first channel equalization buffer and a first output coupled with a first driver circuit. The transmitter may also include a second pre-driver circuit may include a second input coupled with a second channel equalization buffer and a second output coupled with a second driver circuit, wherein an output of the second driver circuit is coupled with an output of the first driver circuit.

In some cases, the transmitter may include a third pre-driver that includes a third input coupled with a first data buffer and that includes a third output coupled with a third driver circuit. In such cases, the transmitter may include a fourth pre-driver circuit that includes a fourth input coupled with a second data buffer and that includes a fourth output coupled with a fourth driver circuit. In such cases, an input of the first channel equalization buffer may be coupled with a first data line and an input of the second channel equalization buffer may be coupled with a second data line. And an input of the first data buffer may be coupled with the first data line and an input of the second data buffer may be coupled with the second data line.

In some cases, the first channel equalization buffer may include a delay component comprising an input and an output; a multiplexor comprising an input and an output, the multiplexor input coupled with the delay component input; and an inverter comprising an input coupled with the delay component output and an output coupled with the multiplexor input.

Figure 7:
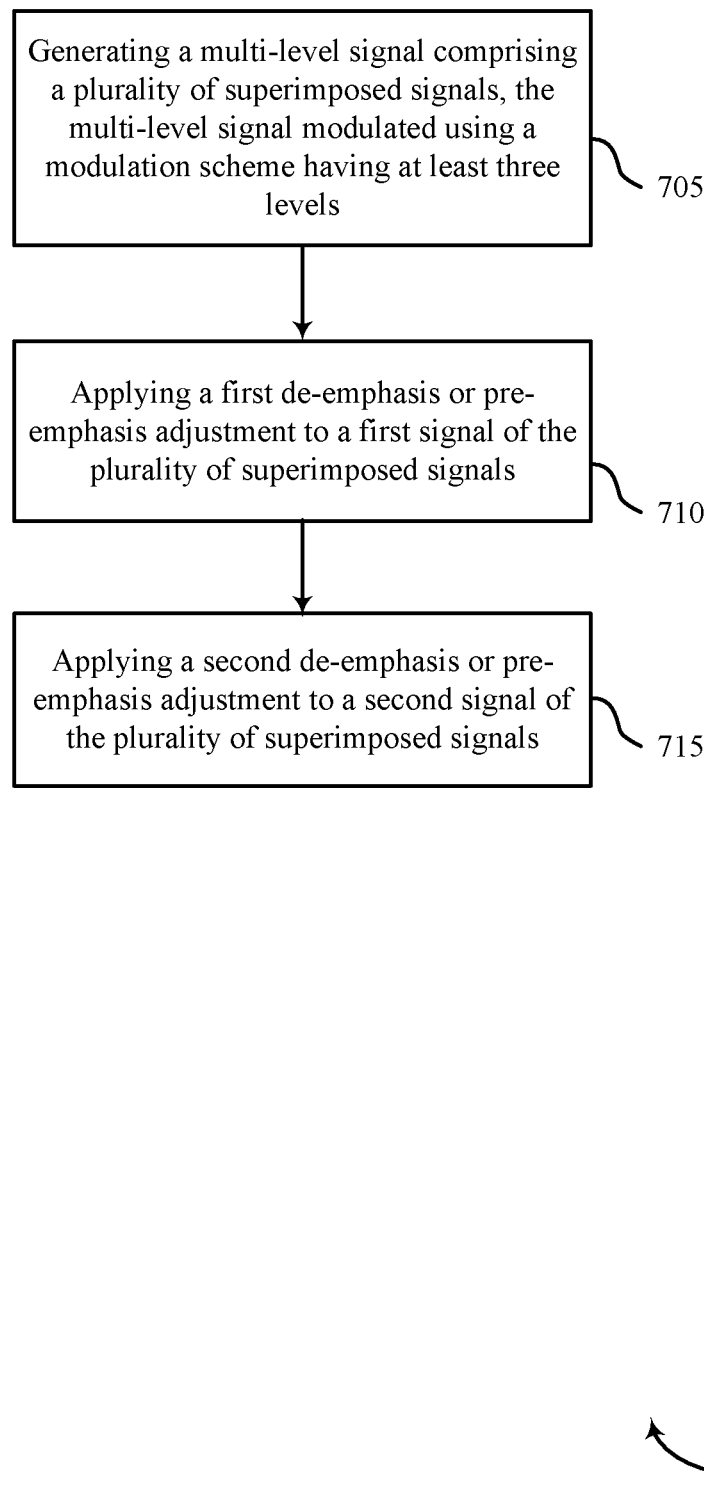
FIG. 7 shows a flowchart illustrating a method of channel equalization for multi-level signals in accordance with various aspect of the present disclosure.

FIG. 7 shows a flowchart illustrating a method 700 that supports channel equalization for multi-level signaling in accordance with aspects of the present disclosure. The operations of method 600 may be implemented by a PAM4 transmitter or its components as described herein. For example, the operations of method 600 may be performed by a PAM4 transmitter as described with reference to FIG. 3.

At 705 the transmitter may generate a multi-level signal comprising a plurality of superimposed signals. The multi-level signal may be modulated using a modulation scheme having at least three levels. At 710, the transmitter may apply a first channel equalization (e.g., de-emphasis or pre-emphasis) adjustment to a first signal of the plurality of superimposed signals. At 715, the transmitter may apply a second channel equalization (e.g., de-emphasis or pre-emphasis) adjustment to a second signal of the plurality of superimposed signals. The first signal may be or include a signal associated with a first bit (e.g., a MSB) of a symbol and the second signal may be or include a signal associated with a second bit (e.g., a LSB) of the same symbol. In some cases, the first de-emphasis (or pre-emphasis) adjustment is based at least in part on a first control signal and the second de-emphasis (or pre-emphasis) adjustment based at least in part on a second control signal. The first control signal may be an inverted and delayed version of a first data signal and the second control signal may be an inverted and delayed version of a second data signal. In some examples, the method may also include adding, superimposing, or combining the de-emphasized (or pre-emphasized) first signal to the de-emphasized (or pre-emphasized) second signal to generate a symbol of the multi-level signal. The symbol may be represented by a level of the multi-level signal.

In some cases, the first channel equalization adjustment is different than the second channel equalization adjustment. In some examples, the channel equalization is applied to the first signal and the second signal prior to superimposing the plurality of signals (e.g., before the first signal and the second signal are superimposed).

Thus, a transmitter may enable channel equalization (e.g., de-emphasis or pre-emphasis) of multi-level signals. According to the techniques described herein, a transmitter may a include first channel equalization buffer in electronic communication with a first pre-driver circuit. The first channel equalization buffer may be configured to delay and invert a first data signal and transfer the delayed and inverted first data signal to the first pre-driver circuit. The transmitter may include a second channel equalization buffer in electronic communication with a second pre-driver circuit. The second channel equalization buffer may be configured to delay and invert a second data signal and transfer (e.g., transport or transmit) the delayed and inverted second data signal to the second pre-driver circuit. The first data signal may represent a first bit in a symbol of a multi-level signal and the second data signal may represent a second bit in the symbol.

The transmitter may also include a first driver circuit configured to receive a modified version of the delayed and inverted first data signal from the first pre-driver circuit. The first driver circuit may be configured to de-emphasize (or pre-emphasize) a signal representative of a logic state that corresponds to the first data signal based at least in part on the modified version of the delayed and inverted first data signal. The transmitter may also include a second driver circuit configured to receive a modified version of the delayed and inverted second data signal from the second pre-driver circuit. The second driver circuit may be configured to de-emphasize (or pre-emphasize) a signal representative of a logic state that corresponds to the second data signal based at least in part on the modified version of the delayed and inverted second data signal. The first driver circuit and the second driver circuit may be a pull-up driver circuit or a pull-down driver circuit. In some cases, the modified version of the delayed and inverted first data signal controls the first driver circuit and the modified version of the delayed and inverted first data signal controls the second driver circuit.

In some cases, the transmitter may include a third pre-driver circuit in electronic communication with the second channel equalization buffer; and a third driver circuit in electronic communication with the third pre-driver circuit. In some cases, the transmitter may include a first data buffer in electronic communication with a third pre-driver circuit, the first data buffer configured to receive the first data signal; and a second data buffer in electronic communication with a fourth pre-driver circuit and a fifth pre-driver circuit, the second data buffer configured to receive the second data signal. In such cases, the transmitter may also include a third driver circuit in electronic communication with the third pre-driver circuit; and a pair of driver circuits comprising a fourth driver circuit in electronic communication with the fourth pre-driver circuit and a fifth driver circuit in electronic communication with the fifth pre-driver circuit.

In some cases, the first channel equalization buffer includes an inverter in electronic communication with a delay component and a multiplexor. In some cases, the first buffer includes an AND gate, rather than a multiplexor, and an input of the AND gate is connected to an output of the inverter In some cases, the transmitter may include a first data line in electronic communication with the first channel equalization buffer, wherein the first channel equalization buffer is configured to receive the first data signal from the first data line; and a second data line in electronic communication with the second channel equalization buffer, wherein the second channel equalization buffer is configured to receive the second data signal from the second data line.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a first driver configured to generate a first electrical pulse representative of a first data bit;
   a second driver coupled with the first driver and configured to reduce an amplitude of the first electrical pulse generated by the first driver;
   a third driver coupled with an output of the first driver and configured to generate a second electrical pulse representative of a second data bit; and
   a fourth driver configured to reduce an amplitude of the second electrical pulse generated by the third driver.

2. The apparatus of claim 1, wherein the first data bit comprises a least significant bit of a symbol of a multilevel signal and the second data bit comprises a most significant bit of the symbol, and wherein the symbol is a combination of the first electrical pulse and the second electrical pulse and the multilevel signal is modulated according to a pulse amplitude modulation scheme comprising three or more levels.

3. The apparatus of claim 2, further comprising:
a fifth driver configured to generate the second electrical pulse in conjunction with the third driver; and
a sixth driver configured to partially reduce the amplitude of the second electrical pulse in conjunction with the fourth driver.

4. The apparatus of claim 1 further comprising:
a controller configured to enable the second driver based at least in part on the amplitude of the first electrical pulse transitioning past a threshold level, wherein the second driver is configured to reduce the amplitude of the first electrical pulse from a first level to a second level based at least in part on being enabled by the controller.

5. The apparatus of claim 4, further comprising:
a buffer circuit coupled with the second driver, wherein the controller is configured to enable the second driver by enabling the buffer circuit, and wherein the second driver is configured to reduce the amplitude of the second electrical pulse after a delay relative to the buffer circuit being enabled.

6. The apparatus of claim 4, further comprising:
a buffer circuit coupled with the second driver, wherein the controller is configured to disable the second driver by disabling the buffer circuit.

7. The apparatus of claim 1, further comprising:
a controller configured to enable the fourth driver based at least in part on the amplitude of the second electrical pulse transitioning past a threshold level, wherein the fourth driver is configured to reduce the amplitude of the second electrical pulse from a first level to a second level based at least in part on being enabled by the controller.

8. The apparatus of claim 7, further comprising:
a buffer circuit coupled with the fourth driver, wherein the controller is configured to enable the fourth driver by enabling the buffer circuit, and wherein the fourth driver is configured to reduce the amplitude of the second electrical pulse after a delay relative to the buffer circuit being enabled.

9. The apparatus of claim 7, further comprising:
a buffer circuit coupled with the fourth driver, wherein the controller is configured to disable the fourth driver by disabling the buffer circuit.

10. The apparatus of claim 1, wherein the second driver is configured to reduce the amplitude of the first electrical pulse partway through the first electrical pulse, and wherein the fourth driver is configured to reduce the amplitude of the second electrical pulse partway through the second electrical pulse.

11. A method, comprising:
generating, by a first driver, a first electrical pulse representative of a first data bit of a symbol in a multilevel signal modulated according to a pulse amplitude modulation scheme with at least three levels;
partially reducing, by a second driver partway through the first electrical pulse, an amplitude of the first electrical pulse to an intermediate level;
generating, by a third driver, a second electrical pulse representative of a second data bit of the symbol in the multilevel signal; and
partially reducing, by a fourth driver partway through the second electrical pulse, an amplitude of the second electrical pulse to an intermediate level.

12. The method of claim 11, further comprising:
combining the first electrical pulse with the second electrical pulse to generate the symbol of the multilevel signal.

13. The method of claim 11, wherein the first data bit comprises a least significant bit of the symbol and the second data bit comprises a most significant bit of the symbol, the method further comprising:
generating, by a fifth driver, the second electrical pulse in conjunction with the third driver; and
partially reducing, by a sixth driver, the amplitude of the second electrical pulse in conjunction with the fourth driver.

14. The method of claim 11, further comprising:
enabling the second driver based at least in part on the amplitude of the first electrical pulse transitioning past a threshold level, wherein the second driver partially reduces the amplitude of the first electrical pulse based at least in part on being enabled.

15. The method of claim 14, wherein enabling the second driver comprises:
enabling a buffer circuit coupled with the second driver, wherein the second driver partially reduces the amplitude of the first electrical pulse after a delay relative to the enablement of the buffer circuit.

16. The method of claim 14, further comprising:
disabling a buffer circuit coupled with the second driver before the second driver partially reduces the amplitude of the first electrical pulse, wherein the second driver is disabled after a delay relative to disablement of the buffer circuit.

17. The method of claim 11, further comprising:
enabling the fourth driver based at least in part on the amplitude of the second electrical pulse transitioning past a threshold level, wherein the fourth driver partially reduces the amplitude of the second electrical pulse based at least in part on being enabled.

18. The method of claim 17, wherein enabling the second driver comprises:
enabling a buffer circuit coupled with the fourth driver, wherein the fourth driver partially reduces the amplitude of the second electrical pulse after a delay relative to the enablement of the buffer circuit.

19. The method of claim 17, further comprising:
disabling a buffer circuit coupled with the fourth driver before the fourth driver partially reduces the amplitude of the second electrical pulse, wherein the fourth driver is disabled after a delay relative to disablement of the buffer circuit.

20. An apparatus, comprising:
a first driver coupled with a second driver;
a third driver coupled with a fourth driver; and
a controller coupled with the first driver, the second driver, the third driver, and the fourth driver, the controller configured to cause the apparatus to:
generate, by the first driver, a first electrical pulse representative of a first data bit of a symbol in a multilevel signal modulated according to a pulse amplitude modulation scheme with at least three levels;
partially reduce, by the second driver partway through the first electrical pulse, an amplitude of the first electrical pulse to an intermediate level;

generate, by the third driver, a second electrical pulse representative of a second data bit of the symbol in the multilevel signal; and partially reduce, by the fourth driver partway through the second electrical pulse, an amplitude of the second electrical pulse to an intermediate level.

\* \* \* \* \*